(12) United States Patent
Akita et al.

(10) Patent No.: US 7,387,678 B2
(45) Date of Patent: Jun. 17, 2008

(54) GAN SUBSTRATE AND METHOD OF FABRICATING THE SAME, NITRIDE SEMICONDUCTOR DEVICE AND METHOD OF FABRICATING THE SAME

(75) Inventors: Katsushi Akita, Itami (JP); Eiryo Takasuka, Itami (JP); Masahiro Nakayama, Itami (JP); Masaki Ueno, Itami (JP); Kouhei Miura, Itami (JP); Takashi Kyono, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 190 days.

(21) Appl. No.: 10/875,512

(22) Filed: Jun. 25, 2004

(65) Prior Publication Data
US 2004/0262624 A1 Dec. 30, 2004

(30) Foreign Application Priority Data
Jun. 26, 2003 (JP) ............................. 2003-183173
Jun. 10, 2004 (JP) ............................. 2004-173059

(51) Int. Cl.
*C30B 29/38* (2006.01)

(52) U.S. Cl. .............................. 117/85; 117/89; 117/90; 117/92; 117/94; 117/95; 252/62.3

(58) Field of Classification Search .................. 117/85, 117/89, 90, 92, 94, 95; 252/62.3

See application file for complete search history.

(56) References Cited

U.S. PATENT DOCUMENTS

| | | | | |
|---|---|---|---|---|
| 2002/0028564 A1* | 3/2002 | Motoki et al. | ............... | 438/460 |
| 2003/0006409 A1* | 1/2003 | Ohba | ............. | 257/18 |
| 2003/0119239 A1* | 6/2003 | Koike et al. | ............... | 438/200 |
| 2003/0134446 A1* | 7/2003 | Koike et al. | ................ | 438/41 |
| 2004/0048448 A1* | 3/2004 | Koike et al. | ............... | 438/459 |
| 2004/0067648 A1* | 4/2004 | Morita et al. | ............... | 438/689 |
| 2004/0155250 A1* | 8/2004 | Ohba | ............. | 257/79 |
| 2005/0093099 A1* | 5/2005 | Koike et al. | ............... | 257/615 |

FOREIGN PATENT DOCUMENTS

JP 11-219909 8/1999

(Continued)

OTHER PUBLICATIONS

Japanese Office Action for Corresponding Application No. JP 2004-173059 Dispatched Feb. 27, 2007.

(Continued)

*Primary Examiner*—Robert M. Kunemund
(74) *Attorney, Agent, or Firm*—McDermott Will & Emery LLP

(57) ABSTRACT

A GaN substrate comprises a GaN single crystal substrate, an $Al_xGa_{1-x}N$ intermediate layer ($0<x\leq 1$) epitaxially grown on the substrate, and an GaN epitaxial layer grown on the intermediate layer. The intermediate layer is made of AlGaN and this AlGaN grows over the entire surface of the substrate with contaminants thereon and high dislocation regions therein. Thus, the intermediate layer is normally grown on the substrate, and a growth surface of the intermediate layer can be made flat. Since the growth surface is flat, a growth surface of the GaN epitaxial layer epitaxially grown on the intermediate layer is also flat.

34 Claims, 14 Drawing Sheets

FOREIGN PATENT DOCUMENTS

| | | |
|---|---|---|
| JP | 2000-12979 | 1/2000 |
| JP | 2000-340509 | 12/2000 |
| JP | 2001-102307 A | 4/2001 |
| JP | 2001-326245 | 11/2001 |
| JP | 2002-190635 | 7/2002 |
| JP | 2003-69156 | 3/2003 |
| JP | 2003-124115 | 4/2003 |
| JP | 2003-229638 | 8/2003 |
| WO | WO 03-034560 A1 | 4/2003 |

OTHER PUBLICATIONS

Chinese Office Action, with English Translation, issued in Corresponding Chinese Patent Application No. 200410062832.2, dated on Jun. 8, 2007.

Japanese Office Action, with English Translation, issued in corresponding Japanese Patent Application No. 2004-173057, dated on Jan. 22, 1008.

* cited by examiner

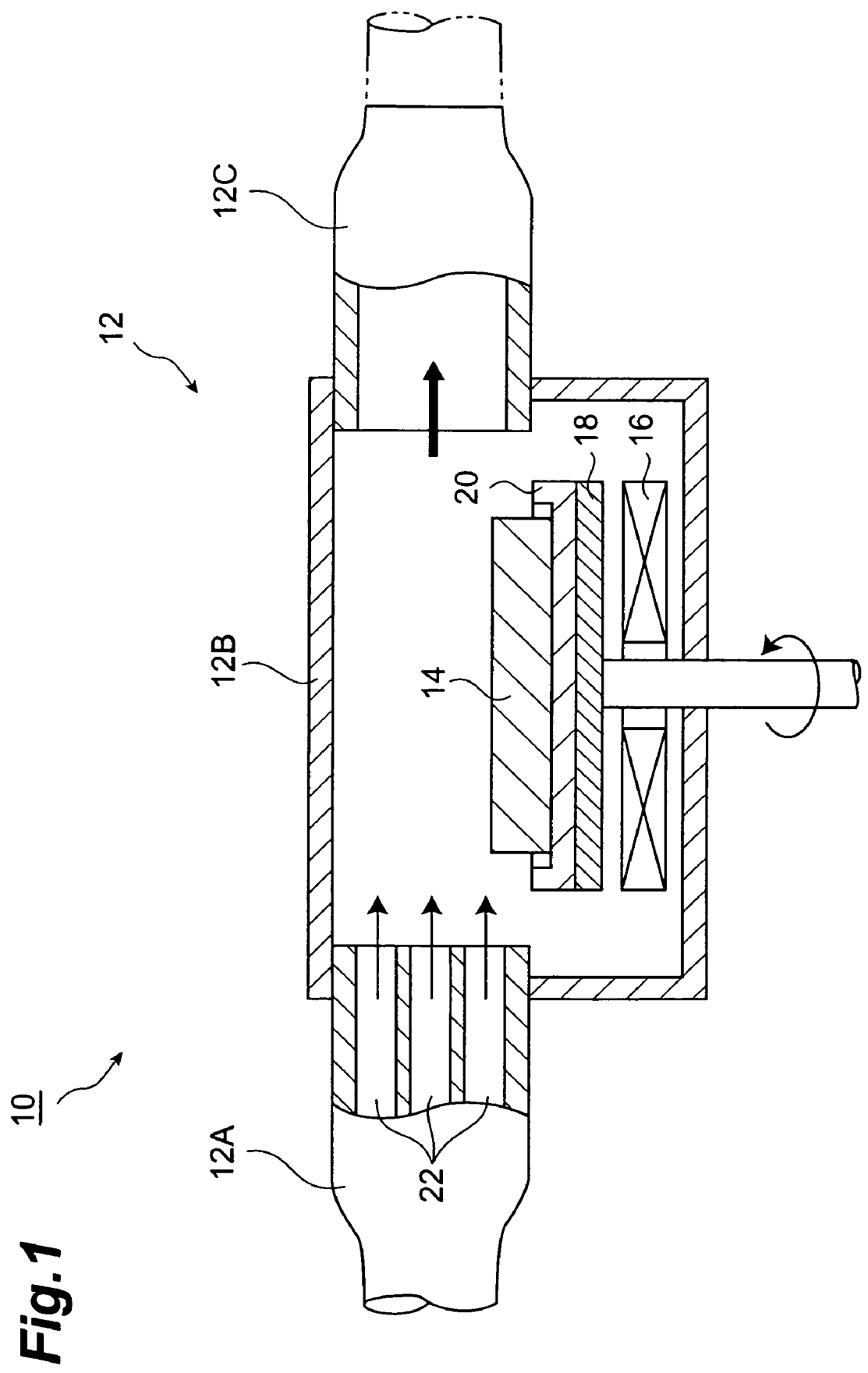

Fig.3A
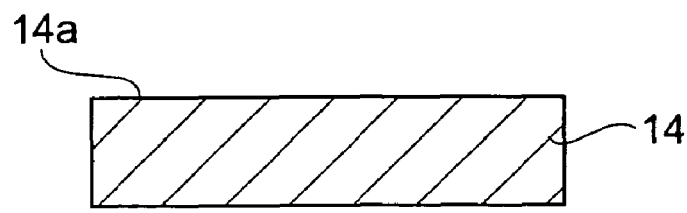
Fig.3B
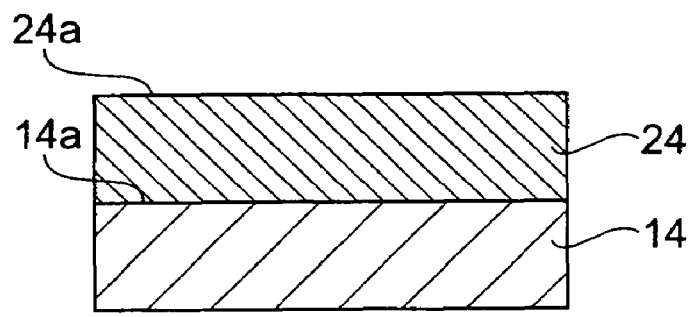
Fig.3C
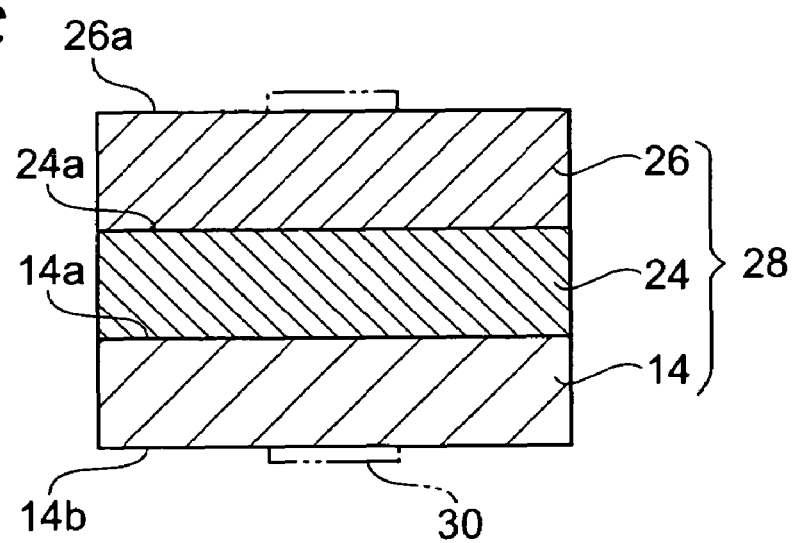

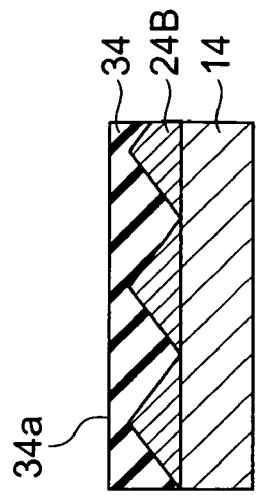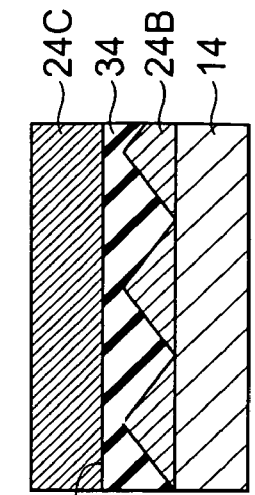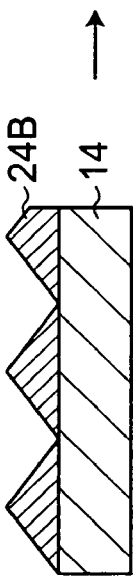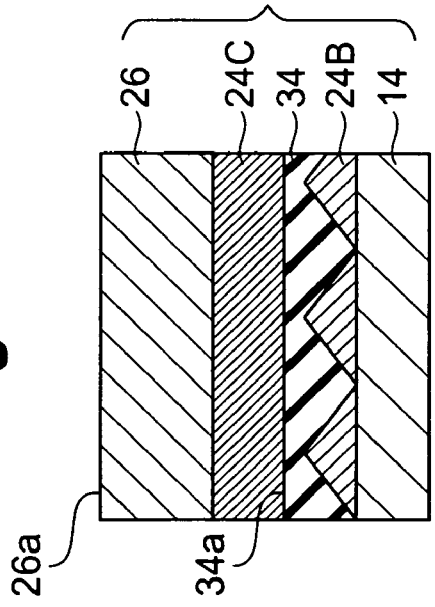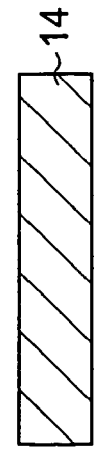

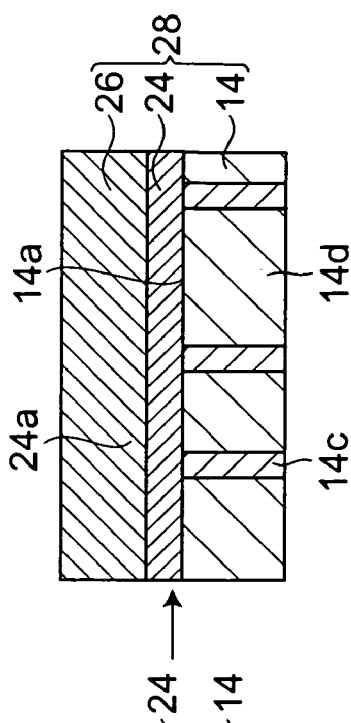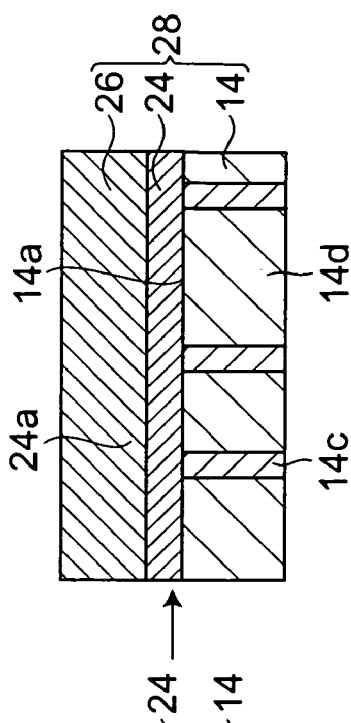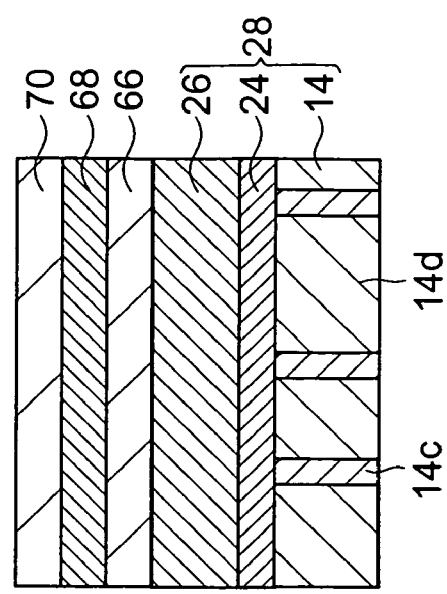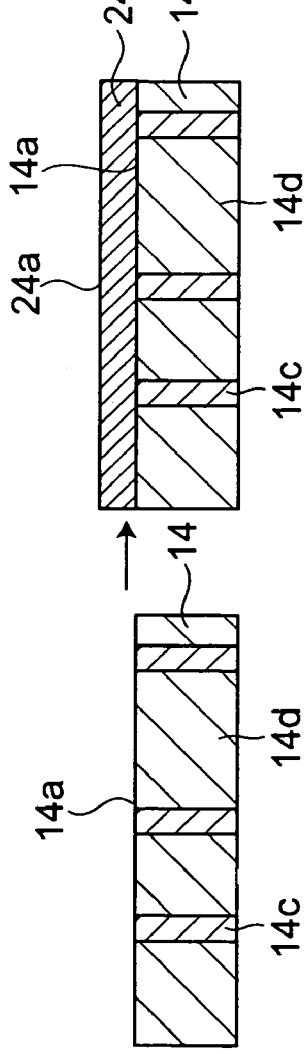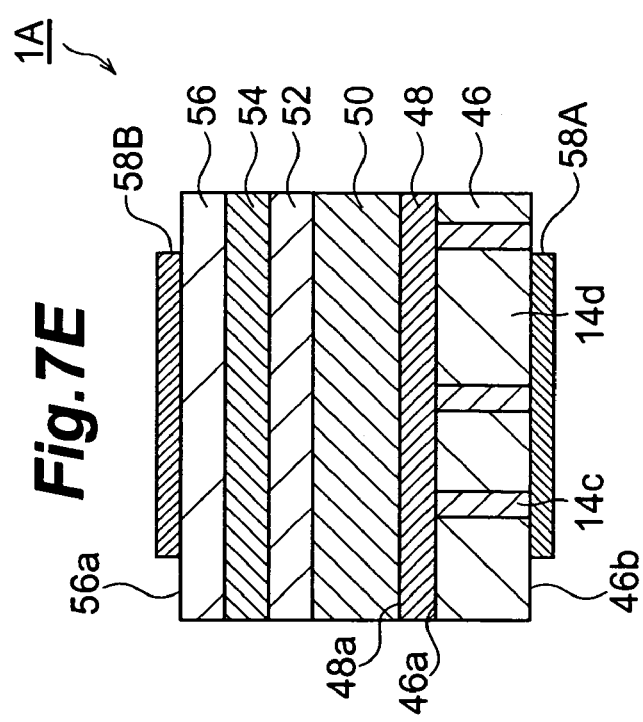

| No. | THICKNESS (um) | x (Al RATIO) | CRACK |
|---|---|---|---|
| 1 | 0.12 | 0.183 | NONE |
| 2 | 0.27 | 0.183 | NONE |
| 3 | 0.11 | 0.181 | NONE |
| 4 | 0.13 | 0.226 | OBSERVED |
| 5 | 0.235 | 0.174 | NONE |
| 6 | 0.108 | 0.242 | OBSERVED |
| 7 | 0.072 | 0.296 | OBSERVED |
| 8 | 0.200 | 0.227 | OBSERVED |
| 9 | 0.072 | 0.271 | OBSERVED |
| 10 | 0.054 | 0.336 | OBSERVED |
| 11 | 0.063 | 0.287 | OBSERVED |
| 12 | 0.200 | 0.194 | NONE |
| 13 | 0.400 | 0.180 | OBSERVED |

GAN SUBSTRATE AND METHOD OF FABRICATING THE SAME, NITRIDE SEMICONDUCTOR DEVICE AND METHOD OF FABRICATING THE SAME

BACKGROUND OF THE INVENTION

1. Field of the Invention

The present invention relates to a GaN epitaxial substrate and a method of fabricating the same and to a nitride semiconductor device and a method of fabrication the same.

2. Related Background Art

Gallium nitride (GaN) is attractive material of substrates for light emitting devices. For example, Japanese Patent Application Laid-Open No. 2001-102307 publication discloses the formation of a GaN substrate. In this formation of GaN substrates, a GaN thick layer is grown by the lateral growth method on a semiconductor single-crystal substrate such as a gallium arsenide (GaAs) substrate. Then, the GaAs substrate is removed from the GaN thick layer and one or more GaN substrates are formed from the GaN thick layer.

Prior to manufacturing semiconductor devices thereon, an epitaxial layer is grown on such a GaN substrate to form a GaN epitaxial substrate. As disclosed in Japanese Patent Application Laid-Open No. 2000-340509 publication, a homoepitaxial layer of GaN, which has the same composition as the substrate, has been grown thereon as the epitaxial layer because researchers thought that the growth of the homoepitaxial layer can reduce the number of defects such as threading dislocations. Particularly, the homoepitaxial layer was used for GaN based semiconductor laser diodes because threading dislocations in the semiconductor layers of the laser diode affect the lifetime thereof.

SUMMARY OF THE INVENTION

However, the GaN substrate fabricated in this manner has the following problem: the GaN homoepitaxial layer is not normally grown on parts of the surface of the GaN substrate if the parts of the surface are contaminated. This will be explained with reference to FIG. 13. In a case where a GaN homoepitaxial layer 42 is grown on a GaN single crystal substrate 40 to fabricate a GaN epitaxial substrate 44, the GaN homoepitaxial layer 42 is not normally grown on areas, for example an area 40b, of the surface 40a of the substrate 40, and depressed areas such as pits are formed in those areas. They seriously damage flatness of the surface of the GaN epitaxial substrate 44. One of causes of the occurrence of the pits may be contaminants which attach to the substrate surface 40a during the production of the substrate 40 and remain on the substrate 40 until the step of growing the GaN homoepitaxial layer 42.

The surface of a GaN substrate manufactured as described in the publication has areas in which the density of threading dislocations is very high. Another cause thereof may be such dense-dislocation areas having a poor crystal quality. This will be explained with reference to FIG. 14A to 14D. As shown in FIG. 14A, the GaN substrate 40 has a number of high dislocation regions 40c which extend in the Z direction. The low dislocation region 40d surrounds each of high dislocation regions 40c that has the density of threading dislocations extremely higher than the low dislocation region 40d. The high dislocation regions 40c are island-shaped and are distributed over the surface of the substrate. If the GaN homoepitaxial layer 42 is grown on the surface 40a, GaN semiconductor grows mainly on low dislocation region 40d and a GaN semiconductor layer does not grows well on the high dislocation regions 40c as shown in FIG. 4C, resulting in the occurrence of pits 42a on the surface of the GaN homoepitaxial layer 42 as shown in FIG. 4D. These pits seriously damage flatness of the surface of the GaN epitaxial substrate 44. The Inventors have conducted elaborate research thereon to end up with finding a technology capable of decreasing the pits from occurring in the surface of the epitaxial layer.

Japanese Patent Application Laid-Open Nos. 2003-229638 and 2002-190635 publications disclose GaN based laser diodes using GaN substrates. The GaN substrates in these publications are different from a GaN single crystal substrate in the claimed invention in the present application because GaN based laser diodes as disclosed in the above publications are formed on epitaxial substrates, each including a GaN wafer and a homoepitaxial intermediate layer grown thereon, so that GaN based epitaxial layers, such as buffer layer and cladding layer, grown on the epitaxial substrates have crystal quality sufficient to achieve the higher optical power of the GaN based laser diodes. Although the GaN based laser diode in Japanese Patent Application Laid-Open No. 2003-229638 publication includes a GaN substrate and an AlGaN cladding layer grown thereon, this AlGaN cladding layer is different from an intermediate layer in the claimed invention as seen from the above explanation. Although Japanese Patent Application Laid-Open No. 2002-190635 publication discloses a GaN substrate and a buffer layer grown thereon, this buffer layer is different from an intermediate layer grown on the GaN wafer as seen from the above explanation. Further, this publication does not disclose a GaN single crystal substrate including high dislocation regions and a low dislocation region that surrounds each high dislocation region.

It is an object of the invention to provide an epitaxial GaN substrates with a flat surface and a method of manufacturing the same and to provide a nitride semiconductor device and a method of manufacturing the same.

According to one aspect of the present invention, a GaN substrate comprises a GaN single crystal substrate, a first $Al_xGa_{1-x}N$ intermediate epitaxial layer ($0<x\leq1$) and a GaN epitaxial layer. The GaN single crystal substrate includes a low dislocation region and high dislocation regions. The low dislocation region has a first density of threading dislocations. Each of the high dislocation regions has a second density of threading dislocations. The low dislocation region surrounds each high dislocation region. The second density of threading dislocations in high dislocation regions is higher than the first density of threading dislocations in the low dislocation region. The low dislocation region and the high dislocation regions appear at a surface of the GaN single crystal substrate. The first $Al_xGa_{1-x}N$ intermediate epitaxial layer ($0<x\leq1$) is provided on the surface. The GaN epitaxial layer is provided on the first $Al_xGa_{1-x}N$ intermediate epitaxial layer.

According to another aspect of the present invention, a GaN substrate comprises a GaN single crystal substrate, a first $Al_xGa_{1-x}N$ intermediate epitaxial layer ($0<x\leq1$) provided on the GaN single crystal substrate and a GaN epitaxial layer provided on the first $Al_xGa_{1-x}N$ intermediate epitaxial layer.

Preferably, in the GaN substrate of the present invention, the high dislocation regions are distributed in the low dislocation region and a density of the high dislocation regions on the surface is equal to or greater than 100 cm$^{-2}$.

In the GaN epitaxial substrate, it is preferable that the first intermediate $Al_xGa_{1-x}N$ epitaxial layer contain carbon and a concentration of carbon in the intermediate layer be not more than $1\times10^{18}$ cm$^{-3}$ and not less than $1\times10^{13}$ cm$^{-3}$.

In the GaN epitaxial substrate, the first intermediate $Al_xGa_{1-x}N$ epitaxial layer is doped with a dopant and the doped first $Al_xGa_{1-x}N$ intermediate layer has one of an n-type conductivity and a p-type conductivity.

The GaN substrate according to the present invention, further comprises a second $Al_yGa_{1-y}N$ intermediate layer ($0<y\leq1$) and a third $Al_zGa_{1-z}N$ intermediate layer ($0\leq z\leq1$). The first $Al_xGa_{1-x}N$ intermediate epitaxial layer and the third $Al_zGa_{1-z}N$ intermediate epitaxial layer is different in composition from the second $Al_yGa_{1-y}N$ intermediate layer. The first $Al_xGa_{1-x}N$ intermediate layer, the second $Al_yGa_{1-y}N$ intermediate layer and the third $Al_zGa_{1-z}N$ intermediate layer are arranged to form a superlattice structure.

The GaN substrate according to the present invention further comprises a fourth $Al_uGa_{1-u}N$ epitaxial intermediate layer ($0<u\leq1$); and an $In_vGa_{1-v}N$ epitaxial layer ($0<v\leq1$) provided between the first intermediate $Al_xGa_{1-x}N$ epitaxial layer and the fourth $Al_uGa_{1-u}N$ epitaxial intermediate layer.

In the GaN substrate according to the present invention, the first $Al_xGa_{1-x}N$ intermediate layer is made of $Al_xGa_{1-x}N$ ($0<x<0.24$) in a thickness of less than ($-5x+1.2$) micrometers.

According to another aspect of the present invention, a method of fabricating a GaN substrate comprises the steps of: epitaxially growing a first $Al_xGa_{1-x}N$ intermediate layer ($0<x\leq1$) on a surface of a GaN single crystal substrate, and epitaxially growing an GaN layer on the intermediate layer. The GaN single crystal substrate includes a low dislocation region and high dislocation regions. The low dislocation region surrounds each high dislocation regions. The low dislocation region has a first density of threading dislocations. Each of the high dislocation regions has a second density of threading dislocations. The second density of threading dislocations in high dislocation regions is higher than the first density of threading dislocations in the low dislocation region. The low dislocation region and the high dislocation regions appear at the surface of the GaN single crystal substrate.

According to another aspect of the present invention, a method of fabricating a GaN substrate comprises the steps of: epitaxially growing a first $Al_xGa_{1-x}N$ intermediate layer ($0<x\leq1$) on a GaN single crystal substrate; and epitaxially growing a GaN layer on the intermediate layer.

In the method according to the present invention, a density of the high dislocation regions on the surface is equal to or greater than 100 $cm^{-2}$.

In the method according to the present invention, it is preferable that the first intermediate $Al_xGa_{1-x}N$ layer contain carbon and a concentration of carbon in the first $Al_xGa_{1-x}N$ intermediate layer be not more than $1\times10^{18}$ $cm^{-3}$ and not less than $1\times10^{13}$ $cm^{-3}$.

In the method according to the present invention, the first $Al_xGa_{1-x}N$ intermediate layer is doped with a dopant in the step of growing a first $Al_xGa_{1-x}N$ intermediate layer, and the first $Al_xGa_{1-x}N$ intermediate layer has an n-type or p-type conductivity.

The method according to the present invention further comprises the steps of forming a second $Al_yGa_{1-y}N$ intermediate layer ($0\leq y\leq1$, $y\neq x$) and forming a third $Al_zGa_{1-z}N$ intermediate layer ($0\leq z\leq1$, $z\neq y$). The second $Al_yGa_{1-y}N$ intermediate layer is different in composition from the first $Al_xGa_{1-x}N$ intermediate layer. The third $Al_zGa_{1-z}N$ intermediate layer is different in composition from the second $Al_yGa_{1-y}N$ intermediate layer. The first $Al_xGa_{1-x}N$ intermediate layer, the second $Al_yGa_{1-y}N$ intermediate layer and the third $Al_zGa_{1-z}N$ intermediate layer are arranged to form a superlattice structure.

The method according to the present invention further comprises the steps of: forming an $In_uGa_{1-u}N$ epitaxial layer ($0<u\leq1$); and forming a fourth $Al_vGa_{1-v}N$ intermediate layer ($0<v\leq1$). The $In_uGa_{1-u}N$ ($0<u\leq1$) epitaxial layer is provided between the first $Al_xGa_{1-x}N$ intermediate layer and the fourth $Al_vGa_{1-v}N$ intermediate layer.

In the method according to the present invention, the first $Al_xGa_{1-x}N$ intermediate layer is made of $Al_xGa_{1-x}N$ ($0<x<0.24$) and has a thickness of less than ($-5x+1.2$) micrometers.

In the method according to the present invention, the first $Al_xGa_{1-x}N$ intermediate layer and the GaN layer are grown under a pressure of not less than 80 kilopascals.

According to still another aspect of the present invention, a nitride semiconductor device comprises: a GaN single crystal substrate, a first $Al_xGa_{1-x}N$ intermediate epitaxial layer ($0<x\leq1$), an n-type nitride semiconductor region and a p-type nitride semiconductor region. The GaN single crystal substrate includes a low dislocation region and high dislocation regions. The low dislocation region has a first density of threading dislocations. Each high dislocation region has a second density of threading dislocations. The low dislocation region surrounds each high dislocation regions. The second density of threading dislocations is higher than the first density of threading dislocations. The low dislocation region has a first density of threading dislocations. Each high dislocation region has a second density of threading dislocations. The low dislocation region and the high dislocation regions appear at a surface of the GaN single crystal substrate. The first $Al_xGa_{1-x}N$ intermediate epitaxial layer ($0<x\leq1$) is provided on the surface. The n-type nitride semiconductor region and a p-type nitride semiconductor region both are provided on the intermediate layer.

In the nitride semiconductor device according to the present invention, a density of the high dislocation regions on the surface is equal to or greater than 100 $cm^{-2}$.

In the nitride semiconductor device according to the present invention, one of the n-type nitride semiconductor region and the p-type nitride semiconductor region includes a GaN upper layer epitaxially grown on the $Al_xGa_{1-x}N$ epitaxial intermediate layer. In this nitride semiconductor device, the growth surface of the upper layer can be made flat by epitaxially growing the upper layer on the intermediate layer even when the surface of the substrate has small unevenness.

The nitride semiconductor device according to the present invention further comprises a light emitting layer provided between the n-type nitride semiconductor region and the p-type nitride semiconductor region. Each of the n-type nitride semiconductor region and the p-type nitride semiconductor region includes a cladding layer.

The nitride semiconductor device according to the present invention further comprises a cathode electrode and an anode electrode. The GaN single crystal substrate is provided between the cathode electrode and the anode electrode. The light emitting layer includes a region for generating light. The region for generating light is provided on one or more of the high dislocation regions. The region for generating light is provided between the cathode electrode and the anode electrode.

In the nitride semiconductor device according to the present invention, the first $Al_xGa_{1-x}N$ intermediate epitaxial layer contains carbon and the doped first $Al_xGa_{1-x}N$ intermediate epitaxial layer has a concentration of carbon not more than $1\times10^{18}$ $cm^{-3}$ and not less than $1\times10^{13}$ $cm^{-3}$.

In the nitride semiconductor device according to the present invention, the first $Al_xGa_{1-x}N$ intermediate epitaxial layer is doped with a dopant and the doped first $Al_xGa_{1-x}N$ intermediate layer has one of an n-type conductivity and a p-type conductivity.

The nitride semiconductor device according to the present invention further comprises an $Al_yGa_{1-y}N$ second intermediate epitaxial layer ($0 \leq y \leq 1$) and a third $Al_zGa_{1-z}N$ intermediate epitaxial layer ($0 \leq z \leq 1$). The first $Al_xGa_{1-x}N$ intermediate epitaxial layer and the third $Al_zGa_{1-z}N$ intermediate epitaxial layer are different in composition from the second $Al_yGa_{1-y}N$ intermediate layer. The first $Al_xGa_{1-x}N$ intermediate layer, the second $Al_yGa_{1-y}N$ intermediate epitaxial layer and the third $Al_zGa_{1-z}N$ intermediate epitaxial layer are arranged to form a superlattice structure.

The nitride semiconductor device according to the present invention further comprises a fourth $Al_uGa_{1-u}N$ epitaxial intermediate layer ($0<u \leq 1$); and an $In_vGa_{1-v}N$ epitaxial layer ($0<v \leq 1$) provided between the first intermediate $Al_xGa_{1-x}N$ epitaxial layer and the fourth $Al_uGa_{1-u}N$ epitaxial intermediate layer.

In the nitride semiconductor device according to the present invention, the first $Al_xGa_{1-x}N$ intermediate layer is made of $Al_xGa_{1-x}N$ ($0<x<0.24$) has a thickness of less than ($-5x+1.2$) micrometers.

Still another aspect of the present invention is a method of fabricating a nitride semiconductor device. The method comprises the steps of: epitaxially growing an intermediate $Al_xGa_{1-x}N$ layer ($0<x \leq 1$) on a surface of a GaN single crystal substrate under a pressure of not less than 80 kilopascals, and epitaxially growing an n-type nitride semiconductor region and a p-type nitride semiconductor region on the intermediate layer under a pressure of not less than 80 kilopascals. The GaN single crystal substrate includes a low dislocation region and high dislocation regions. The low dislocation region surrounds each high dislocation regions. Each high dislocation region has a second density of threading dislocations. The low dislocation region has a first density of threading dislocations. The second density of threading dislocations in high dislocation regions is higher than the first density of threading dislocations in the low dislocation region. The low dislocation region and the high dislocation regions appear at a surface of the substrate.

In the method according to the present invention, a density of the high dislocation regions on the surface is equal to or greater than 100 $cm^{-2}$.

In the method according to the present invention, the first $Al_xGa_{1-x}N$ intermediate layer is made of $Al_xGa_{1-x}N$ ($0<x<0.24$) has a thickness of less than ($-5x+1.2$) micrometers.

BRIEF DESCRIPTION OF THE DRAWINGS

FIG. 1 is a view showing a vapor growth apparatus used in fabrication of an epitaxial substrate according to the first embodiment of the present invention.

FIGS. 3A, 3B and 3C are views showing the steps of fabricating a GaN epitaxial substrate.

FIGS. 5A, 5B, 5C, 5D and 5E are views showing the steps of fabricating a GaN epitaxial substrate.

FIGS. 7A, 7B, 7C, 7D and 7E are views showing the steps of fabricating a GaN epitaxial substrate.

DESCRIPTION OF THE PREFERRED EMBODIMENTS

Figure 2A:
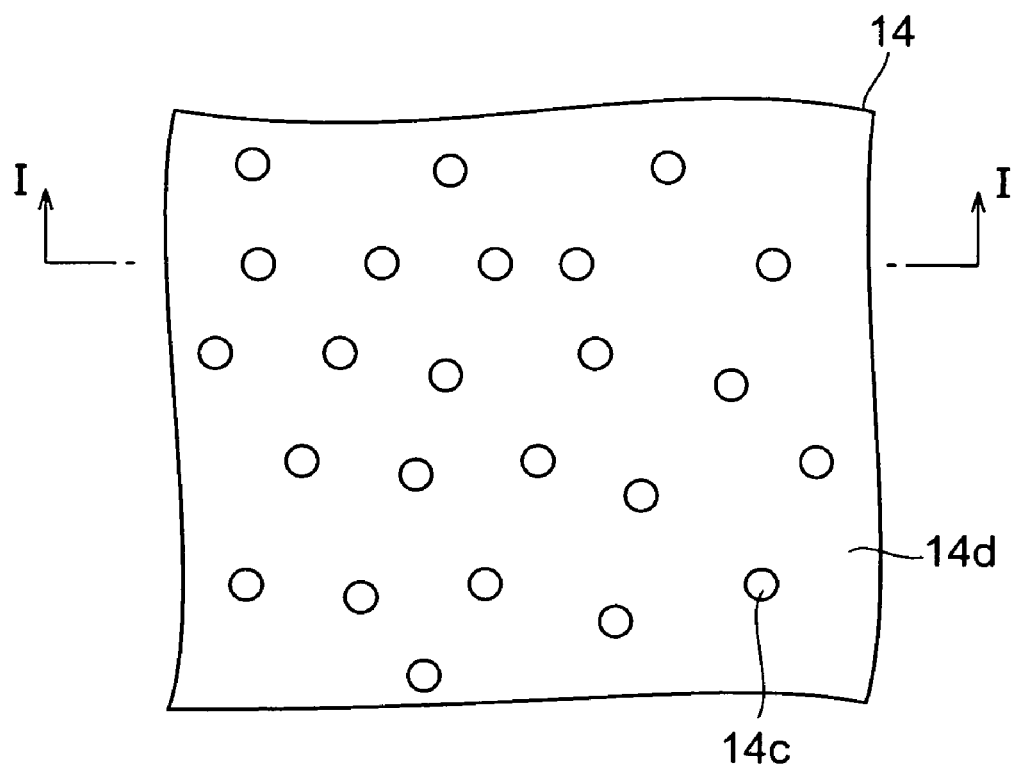
FIG. 2A is a top view showing a part of the surface of the GaN substrate.

Embodiments of a GaN epitaxial substrate, a method of fabricating the GaN epitaxial substrate, a nitride semiconductor device and a method of manufacturing the same according to the present invention will be described below in detail with reference to the accompanying drawings. To facilitate understanding, identical reference numerals have been used, where possible, to designate identical elements that are common to the figures.

First Embodiment

FIG. 1 is a view showing a vapor growth apparatus used in fabrication of a GaN epitaxial substrate according to the first embodiment of the present invention. This vapor growth apparatus 10 may be, for example, a horizontal type metalorganic chemical vapor deposition apparatus (MOCVD) having a quartz flow channel 12 providing gas flow paths in the horizontal direction. A substrate 14, such as a GaN wafer, for fabricating a GaN epitaxial substrate is placed in a tray 20 on a susceptor 18 having a heater 16 therein, and the susceptor 18 rotatably supports the substrate 14.

The flow channel 12 includes an upstream flow channel portion 12A, an intermediate flow channel portion 12B, and a downstream flow channel portion 12C. Gases for depositing GaN crystal are supplied through three-tiered nozzles 22 in the upstream flow channel portion 12A, and these gases are mixed immediately before the substrate 14 in the intermediate flow channel portion 12B. Reaction productions and residual gases are evacuated through the downstream flow channel portion 12C.

Trimethyl gallium (TMG) and/or trimethyl aluminum (TMA) and/or trimethyl indium (TMI) are used as a Group-III source gas. $NH_3$ is used as a Group-V source gas. Monosilane ($SiH_4$) is used as an n-type dopant gas. Cyclopentadienyl magnesium ($Cp_2Mg$) is used as a p-type dopant gas. Some of these gases are supplied through the nozzles 22 onto the substrate as required. For example, hydrogen gas ($H_2$ gas) and/or nitrogen gas ($N_2$ gas) can be used as a carrier gas. The Group-III source gases are supplied through supplying lines to the nozzle 22, respectively. Switching valves (not shown) are placed between the nozzle 22 and the respective supplying lines. Flow rates of the respective Group-III source gases are regulated by controlling the switching valves. Specifically, each switching valve is used to switch a flow of a Group-III source gas fed through one or both of the main line to the nozzle 22 and the dummy line for exhaust, thereby achieving the interruption of each Group-III source gas and the stabilization of flow rate.

Figure 2B:
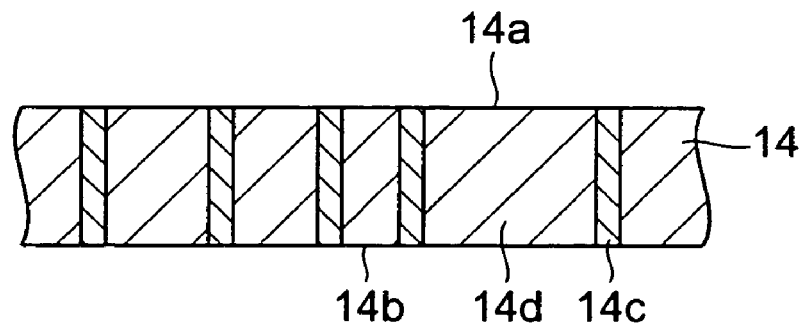
FIG. 2B is a cross sectional view, taken along line I-I of FIG. 2A, showing the GaN substrate.

The substrate 14 used in the present embodiment will be described below. FIG. 2A is a top view showing a part of the surface of the GaN substrate. FIG. 2B is a cross sectional view, taken along line I-I in FIG. 2A, showing the GaN substrate. This substrate 14 is manufactured as follows: A mask layer having a plurality of opening windows is formed on a GaAs substrate and GaN material is laterally grown on the GaAs substrate inside the opening windows of the mask layer. After the lateral growth, the GaAs substrate is removed off by aqua regalis etchant. The front and back surfaces 14a, 14b are mechanically polished to form the GaN substrate 14.

The surface of the GaN substrate 14 has parts in which the density of threading dislocations is very high as compared to their surrounding area. As shown in FIG. 2B, the GaN substrate 14 has high dislocation regions 14c which extend in the Z direction. The low dislocation region 14d surrounds each of the high dislocation regions 14c that have the density of threading dislocations extremely higher than that of the low dislocation region 14d. The surface of the GaN substrate is dotted with the tops of the high dislocation regions 14c. The average density of threading dislocations in the high dislocation regions 14c is ten times as high as that in the low dislocation region 14d. GaN substrates in the present embodiment are made from a thick GaN layer formed by lateral growth; in the lateral growth, a number of depressed areas, such as pits each constituted by a plurality of facets, are formed on the surface of the thick GaN layer. Threading dislocations and other defects in the growing GaN layer of the present embodiment tend to gather as the thick GaN layer grows, resulting in forming the high dislocation regions in which the density of the above dislocations is high. The threading dislocations in the high dislocation regions form pits at the surface of the GaN substrate. The pits appear in island-shaped areas of the surface. The island-shaped areas are irregularly or randomly distributed over the surface of the substrate. The average density of the high dislocation regions 14c on the surface of the GaN substrate is not less than 100 per square centimeters ($cm^{-2}$). As described above, the high dislocation regions 14c and the low dislocation region 14d appear at the surface of the GaN substrate to form high dislocation areas and a low dislocation area, respectively. The ratio of the total dimension of the high dislocation areas to the dimension of the whole surface of the substrate is equal to or less than one percent. The average density of threading dislocations in the high dislocation areas is equal to or less than $3\times10^7$ per square centimeters ($cm^{-2}$) and equal to or more than $1\times10^6$ per square centimeters ($cm^{-2}$), and the average density of threading dislocations in the low dislocation area is equal to or less than $5\times10^6$ per square centimeters ($cm^{-2}$). The average density of threading dislocations in the high dislocation areas is greater than the average density of threading dislocations in the low dislocation area. In one example, the size of the GaN substrate is not less than one inch.

A procedure of fabricating a GaN epitaxial substrate according to the present embodiment will be described below with reference to FIGS. 3A, 3B and 3C. FIGS. 3A to 3C are cross sectional views showing the procedure of fabricating the GaN epitaxial substrate.

First, a GaN single crystal substrate 14 is placed on the tray 20 on the susceptor 18 in the flow channel 12 as shown in FIG. 3A. The GaN substrate 14 has the upper surface 14a of (0001) face. Prior to growing an epitaxial layer on the GaN substrate 14, a gas mixture containing $NH_3$ gas is supplied through the nozzles 22 to fill the flow channel 12 with the atmosphere of the gas mixture. Then, the suspector 18 and substrate 14 are heated to about Celsius 1100 degrees (° C.) by the heater 16 to carry out the process of cleaning the front surface 14a of the substrate 14 (thermal cleaning). Specifically, the gas mixture is prepared by flowing $NH_3$ in the flow rate of 5 slm and $H_2$ in the flow rate of 6 slm. The thermal cleaning removes contaminants from the surface 14a of the substrate and improves the flatness of the substrate surface 14a.

Next, the temperature of the substrate 14 (substrate temperature) is kept at Celsius 1100 degrees (° C.) and the pressure in the intermediate flow channel is kept at 80 kilopascals (kPa) or more, and the Group-III source gas, Group-V source gas and doping gas are supplied together with the carrier gas through the nozzles 22 onto the substrate 14 to grow an $Al_xGa_{1-x}N$ intermediate layer 24 (intermediate layer forming step, FIG. 3B). In one example, TMG and TMA gases are supplied for 23 minutes in the condition of 24.42 micromoles per minute (μmol/min) and 2.02 micromoles per minute (μmol/min), respectively, and the flow rate of $NH_3$ and $H_2$ gases are 6 slm and 8 slm, respectively. This results in growing an intermediate layer 24 of $Al_xGa_{1-x}N$ (x=0.08) in the thickness of 200 nanometers (nm) on the substrate 14. The composition ratio x of aluminum can be within the range of $0<x\leq1$. Preferably, the thickness of the intermediate layer 24 can be within the range from 10 nanometers (nm) to 500 nanometers (nm) and can be changed by the growth conditions of the intermediate layer. The thickness of the intermediate layer 24 over the above range increases the possibility of occurrence of defects such as cracks. As will be described later in an example, the inventors have found that defects such as cracks can be successfully suppressed if the thickness of the intermediate layer 24 is less than $(-5x+1.2)$ micrometers (μm) in the composition ratio x of aluminum within the range of $(0<x<0.24)$.

Figure 13:
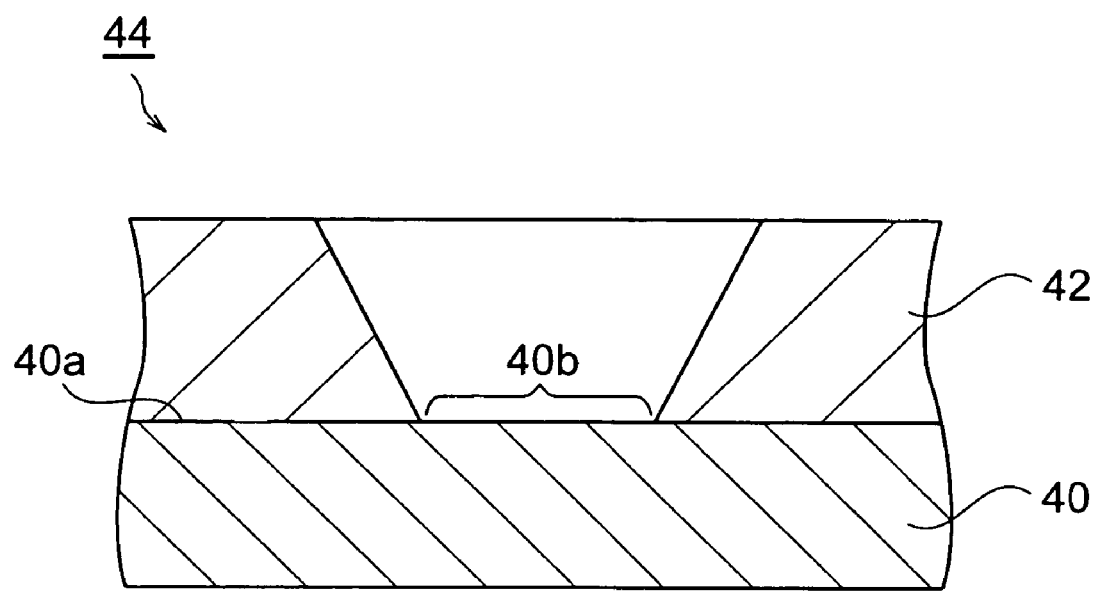
FIG. 13 is a schematic sectional view showing a surface state of a conventional GaN substrate.
Figure 14A:
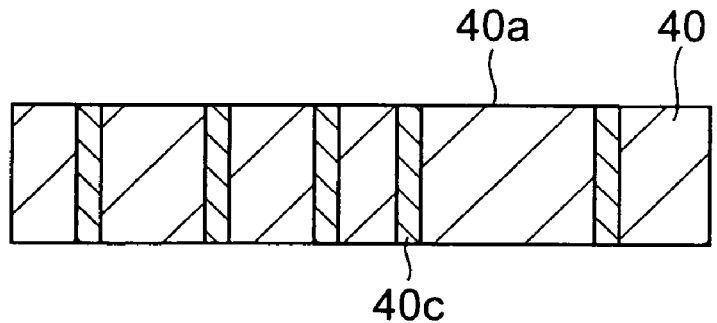
FIG. 14A is a cross sectional view showing the relevant GaN substrate.
Figure 14B:
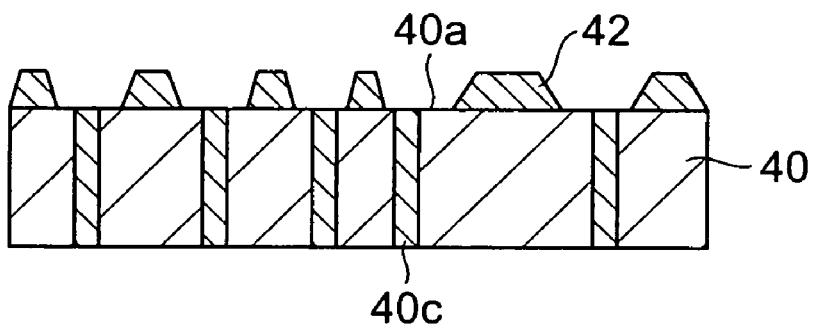
FIGS. 14B, 14C and 14D show cross sectional views showing the growth of a homoepitaxial layer on the GaN substrate.
Figure 14C:
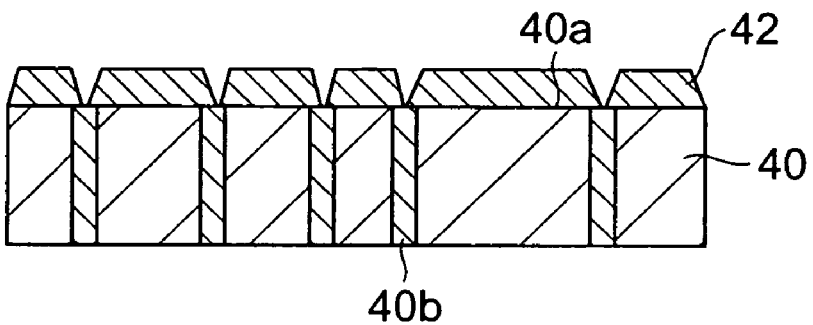
Figure 14D:
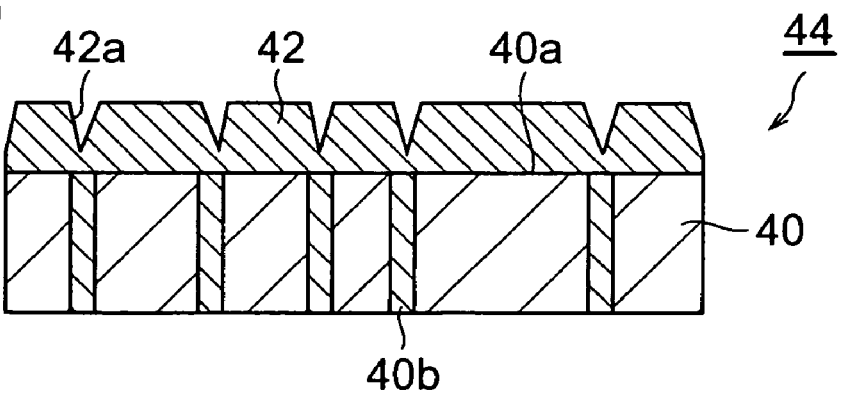

The AlGaN intermediate layer 24 is formed on the GaN single crystal substrate 14 to form an epitaxial substrate, and the AlGaN intermediate layer 24 grows over the entire surface 14a, i.e., both the high dislocation areas and low dislocation area. On the other hand, if a GaN layer is directly grown on the substrate 14, normal epitaxial growth does not occur on parts of the substrate surface 14a to form pits (as shown in FIGS. 13 and 14), which must seriously damage the flatness of the surface of the GaN epitaxial substrate.

The Inventors think that the undesired flatness of the surface of the latter GaN epitaxial substrate is caused by the following: contaminants on the surface 14a of the substrate 14; insufficient crystal quality of the high dislocation regions 14c. The Inventors have conducted elaborate research and have found that depositing an AlGaN layer (intermediate layer 24) on the substrate 14 is effective in obtaining the desired flatness thereof. In other words, the intermediate layer 24 of AlGaN grows over the contaminated areas in the surface of the substrate and over the high dislocation regions 14c, and the surface 24a of the intermediate layer 24 is made flat and exhibits a good morphology. During the process of forming the intermediate layer 24, carbon is introduced into the intermediate layer 24, but the concentration of carbon is low, approximately not more than $1\times10^{18}$ $cm^{-3}$.

After forming the intermediate layer 24 on the substrate 14, the substrate temperature is increased to Celsius 1150 degrees (° C.) and a GaN upper layer 26 is epitaxially grown under a pressure of not less than 80 kilopascals (kPa) (upper layer forming step), thereby completing the fabrication of a GaN epitaxial substrate 28, i.e., a GaN epitaxial wafer (as shown in FIG. 3C). The surface 24a of the intermediate layer 24 is made flat as described above, and thus the surface 26a of the upper layer 26 (i.e., the surface of the GaN epitaxial substrate 28) is also made flat because the upper layer 26 is epitaxially grown on the intermediate layer 24 with good crystallinity.

A light emitting device fabricated using the GaN epitaxial substrate 28 includes electrodes 30 provided on the bottom surface 14b of the substrate 14 and on the surface 26a of the upper layer 26.

As described above, the intermediate layer 24 is provided between the substrate 14 and the upper layer 26 in the GaN epitaxial substrate 28. This intermediate layer 24 is made of $Al_xGa_{1-x}N$ ($0<x\leq1$, $x=0.08$ in the present example), and AlGaN material is epitaxially grown over the entire surface 14a, i.e., over both parts of the surface 14a with contaminants and the tops of the high dislocation regions 14c. Thus, the $Al_xGa_{1-x}N$ intermediate layer 24 is normally grown on the substrate 14 and its surface 24a created by the growth becomes flat. Since the upper layer 26 is epitaxially grown on the flat surface 24a of the intermediate layer 24, the surface 26a is also made flat.

For reducing the resistivity of the intermediate layer 24 by providing the intermediate layer 24 with electrical conductivity, $SiH_4$ gas is diluted in 10 ppm with $H_2$ and the diluted $SiH_4$ gas is flown as dopant in the flow rate of 2.5 sccm in the step of forming the intermediate layer 24, whereby the intermediate layer 24 have an n-type conductivity in the carrier density of $5\times10^{18}$ cm$^{-3}$. If $Cp_2Mg$ is flown as dopant in the condition of 0.0539 micromoles per minute (μmol/min) in the step of forming the intermediate layer 24, the intermediate layer 24 has a p-type conductivity in the carrier density of $5\times10^{17}$ cm$^{-3}$. In order to increase the density of p-type carriers, it is necessary to subject the intermediate layer 24 to another activation process. If the GaN epitaxial substrate 28 includes the intermediate layer 24 with decreased resistivity, the GaN epitaxial substrate 28 is useful for fabricating a vertical structure device, such as light emitting diode (LED) or heterojunction bipolar transistor (HBT), both having improved device characteristics.

In the present embodiment, it is preferable to grow the intermediate layer 24 and upper layer 26 under the pressure of not less than 80 kilopascals (kPa). Since AlGaN material can be grown over the entire surface 14a of the substrate 14 as explained above, the growth surface 24a of the intermediate layer 24 can be made flat even if the intermediate layer 24 is grown under the relatively high pressure of not less than 80 kilopascals (kPa). Accordingly, by growing the intermediate layer 24 and the upper layer 26 under such a relatively high pressure, it is feasible to obtain the intermediate layer 24 and upper layer 26 both having good crystallinity.

The average density of the high dislocation regions 14c may be equal to or more than 100 per square centimeters (cm$^{-2}$). Even when the average density of the high dislocation regions 14c at the surface 14a is as high as the above value, the AlGaN intermediate layer improves the flatness of the surface thereof, and further improves the flatness of the surface of the upper layer 26.

(The First Modification)

With reference to FIGS. 4A, 4B, 4C, 4D and 4E, another GaN epitaxial substrate and a method of fabricating the same will be described below. The other GaN substrate is different from the above-described epitaxial substrate. FIGS. 4A to 4E are views showing the procedure of fabricating the other GaN epitaxial substrate.

First, an intermediate layer 24 is deposited on a substrate 14 by a method similar to that of fabricating the above-described GaN epitaxial substrate 28. Specifically, the substrate 14 is placed in the tray 20 of the apparatus 10, and the substrate 14 has the top surface 14a of (0001) face. The substrate 14 is subjected to a cleaning process (FIG. 4A), and TMG and TMA gases are supplied and $NH_3$ and $H_2$ gases are flown under conditions similar or equivalent to the aforementioned conditions to grow an intermediate layer 24A of $Al_xGa_{1-x}N$ ($x=0.16$) in the thickness of about several nanometers (nm) on the substrate 14 (FIG. 4B).

Figure 4C:
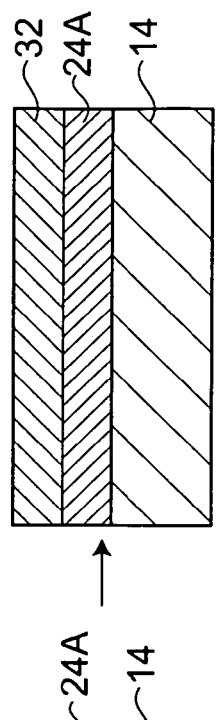
FIGS. 4A, 4B, 4C, 4D and 4E are views showing the steps of fabricating a GaN epitaxial substrate.
Figure 4B:
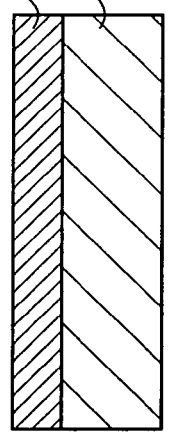
Figure 4A:
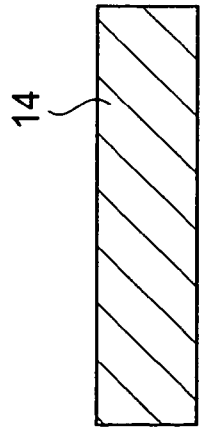
Figure 4D:
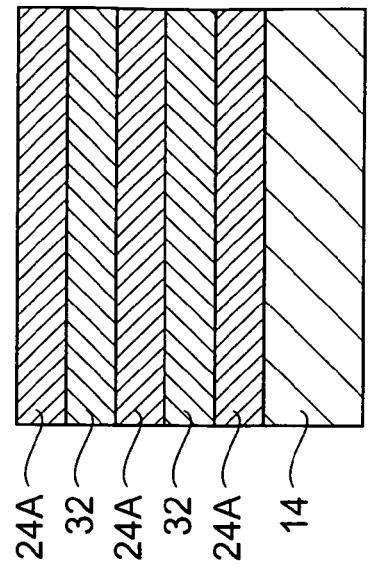

Next, the switching valves on the upstream of the nozzles 22 are controlled to interrupt only the supply of TMA, without any change in the other conditions, to deposit an epitaxial thin film (second intermediate layer) 32 of GaN (i.e., $Al_yGa_{1-y}N$ ($y=0$)) in the thickness of about several nanometers (nm) on the intermediate layer 24A (FIG. 4C). The above control of the switching valves is repeated to alternately deposit other intermediate layers 24A and epitaxial thin films 32 on the first epitaxial thin film 32 (FIG. 4D) so as to form a superlattice structure having, for example, five layers. Thereafter, an upper layer 26 is epitaxially grown on the uppermost intermediate layer 24A to fabricate the GaN epitaxial substrate 28A different from the aforementioned GaN epitaxial substrate 28.

In the GaN epitaxial substrate 28A having the superlattice structure (strained superlattice structure) including the intermediate layers 24A and the epitaxial thin films 32 of $Al_yGa_{1-y}N$ ($0\leq y\leq1$) of the composition different from that of the intermediate layers 24A, the superlattice structure prevents threading dislocations from extending from the substrate 14 to the upper layer thereon. The superlattice structure in the epitaxial substrate 28A is effective in reducing the dislocation density in the GaN epitaxial substrate 28A and improves crystallinity of the GaN epitaxial substrate 28A, and thus the substrate 28A is useful for fabricating semiconductor devices with excellent characteristics. The material of the epitaxial thin films 32 is not limited to GaN material and can be selected from $Al_yGa_{1-y}N$ ($0\leq y\leq1$) of compositions different from that of the intermediate layers 24A. The number of layers in the superlattice structure including the intermediate layers 24A and epitaxial thin films 32 is not limited to five, but the number of layers may be increased or decreased according to need.

(The Second Modification)

With reference to FIGS. 5A, 5B, 5C, 5D and 5E, another GaN epitaxial substrate and a method of fabricating the same will be described below. The other GaN epitaxial substrate of this modification is different from the above-described GaN epitaxial substrate and a method of fabricating a GaN epitaxial substrate. FIGS. 5A to 5E are views showing the procedure of fabricating the other GaN substrate.

An intermediate layer 24 is deposited on a substrate 14 by a method similar to the above-described method of fabricating the GaN epitaxial substrate 28. In one example, the substrate 14 is placed in the tray 20 of the apparatus 10, and the substrate 14 has the top surface 14a of the (0001) surface. The substrate 14 is subjected to a cleaning process (FIG. 5A). TMG is supplied for 11.5 minutes in 24.42 micromoles per minute (μmol/min) and TMA is suppled in 2.02 micromoles per minute (μmol/min), under the conditions of the substrate temperature of Celsius 1100 degrees (° C.) and the pressure of not less than 80 kilopascals (kPa). $NH_3$ and $H_2$ gases are flown in the conditions of 6 slm and 8 slm, respectively. By use of this condition, an intermediate layer 24B of $Al_xGa_{1-x}N$ (x=0.08) is grown on the substrate 14 (FIG. 5B) in the thickness of 100 nanometers (nm).

Even when AlGaN material is used for the intermediate layer, an AlGaN used as the intermediate layer may be abnormally grown on the substrate 14 as shown in FIG. 5B because of various reasons, such as an abnormal epitaxial growth, and the AlGaN intermediate layer does not have a desired surface flatness. In this case, an InGaN epitaxial layer is grown on this intermediate layer 24B. In one example, TMG is supplied for five minutes at 24.42 micromoles per minute (μmol/min) and TMI at 11.16 micromoles per minute (μmol/min) onto the intermediate layer 24B, under the condition of the substrate temperature of Celsius 830 degrees (° C.) and the pressure of not less than 80 kilopascals (kPa), and $NH_3$ and $H_2$ gases are flown in the flow rate of 6 slm and 8 slm, respectively, thereby growing an epitaxial layer 34 of $In_zGa_{1-z}N$ (for example, z=0.10) in the thickness of 50 nm on the intermediate layer 24B (FIG. 5C). The Inventors have found that even when the substrate surface 14a is heavily contaminated and the density of the high dislocation regions 34 is high sufficient to cause abnormal growth of the intermediate layer 24B and to fail to achieve satisfactory flatness of the intermediate layer 24B, the InGaN layer 34 grown on the intermediate layer 24B provides the surface 34a that has flatness superior to that of the intermediate layer 24B.

Figure 4E:
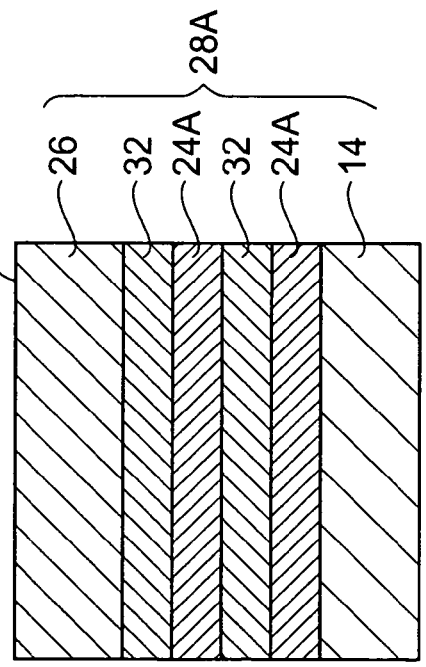

After the growth of the InGaN epitaxial layer 34 with the flat top surface 34a, an intermediate layer 24C can be grown on the InGaN epitaxial layer 34 under a condition similar or equal to those for the intermediate layer 24B (FIG. 5D) and an upper layer 26 can be epitaxially grown on the intermediate layer 24C under conditions similar to those for the aforementioned upper layer to complete the GaN epitaxial substrate 28B (FIG. 4E). Since the intermediate layer 24C is grown on the InGaN epitaxial layer 34, the intermediate layer 24C prevents the surface of the InGaN epitaxial layer 34 from decomposing into constituent atoms at the increased substrate temperature during the formation of the upper layer 26.

As described above, in this GaN epitaxial substrate 28B having the InGaN epitaxial layer 34 provided between the intermediate layers 24B and 24C, even when satisfactory surface flatness is not achieved because of abnormal growth of the intermediate layer 24B, the combination of the InGaN epitaxial layer 34 and the intermediate layer 24C makes the flatness of the top surface 26a of the GaN epitaxial substrate 28B better. It is also possible to form the aforementioned superlattice structure by changing the aluminum concentration of the intermediate layers 24B and 24C and the indium concentration of the InGaN epitaxial layer 34. As required, GaN thin films may be provided between the intermediate layer 24B and 24C and the InGaN epitaxial layer 34.

Figure 6:
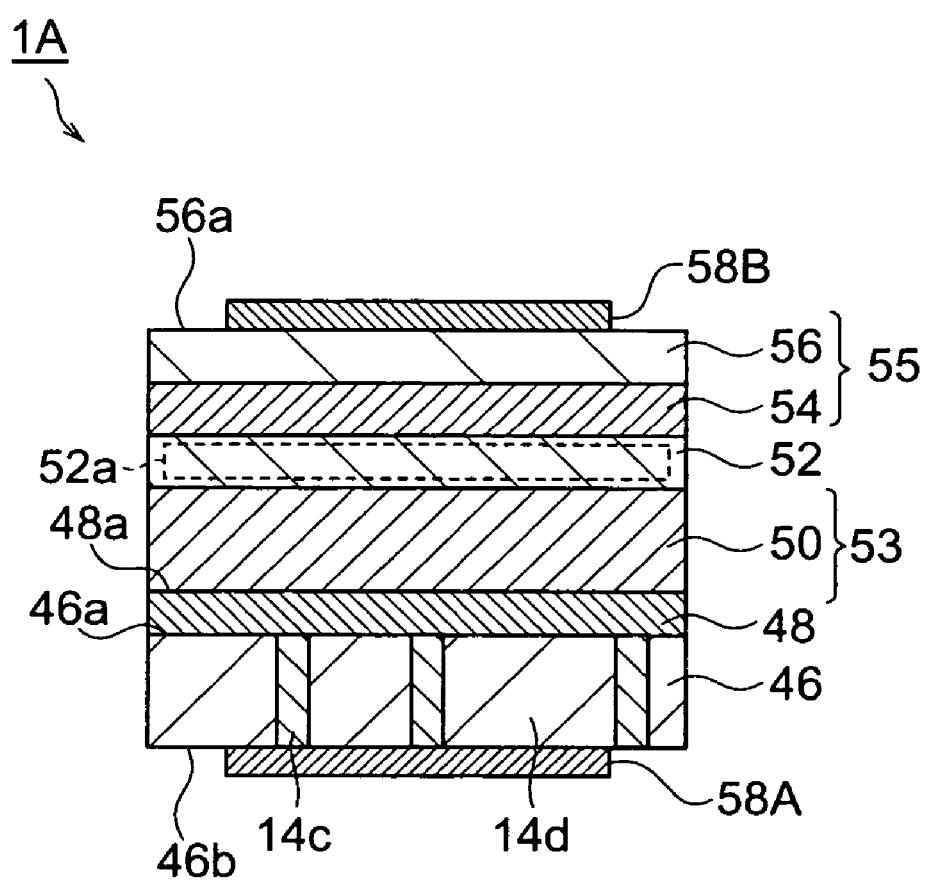
FIG. 6 is a sectional view showing a light emitting device according to the second embodiment of the present invention.

Second Embodiment nitride semiconductor device and a method of fabricating a nitride semiconductor device according to the second embodiment of the present invention will be described with reference to FIG. 6. FIG. 6 is a cross sectional view showing a nitride semiconductor light emitting device 1A according to the present embodiment. In the present embodiment, a blue LED is exemplified as the light emitting device 1A.

The light emitting device 1A includes an electrically conductive substrate 46, such as supporting body, made of a GaN single crystal and having a primary surface 46a and a back surface 46b. The GaN substrate 46 has high dislocation regions 14c which extend in the Z direction as in the GaN substrate 14. The surface of the GaN substrate 46 has areas in which the high dislocation regions 14c appear and in which the density of threading dislocations is very high as compared to its neighbor area. The surface of the GaN substrate is dotted with the high dislocation regions 14c. The average density of threading dislocations in the high dislocation regions 14c is ten times as high as that in the low dislocation region 14d. The low dislocation region 14d surrounds each of the high dislocation regions 14c that have the density of threading dislocations extremely higher than that of the low dislocation region 14d. The high dislocation regions 14c appear in the island-shaped areas of the surface 46a and are irregularly or randomly distributed over the surface 46a of the substrate 46. The density of the high dislocation regions, the threading dislocation densities of the high dislocation regions 14c and the low dislocation region 14d, the ratio of the total dimension of the high dislocation areas to the dimension of the whole surface of the substrate 46 are described above. The light emitting device 1A also has an intermediate layer 48, an n-type nitride semiconductor region 53, a light emitting layer 52, and a p-type nitride semiconductor region 55 which are epitaxially grown sequentially on the primary surface 46a of the substrate 46. The light emitting device 1A has a cathode electrode 58A provided on the back surface 46b of the substrate 46 and an anode electrode 58B provided on the p-type nitride semiconductor region 55. The cathode electrode 58A is provided on both the high dislocation regions 14c and the low dislocation region 14d to supply the first carries thereto, and the anode electrode 58B is provided on both the high dislocation regions 14c and the low dislocation region 14d to supply the second carries thereto. Some of the high dislocation regions 14c are provided between the cathode electrode 58A and the anode electrode 58B. The first and second carriers are recombined in the region 52a.

In the present embodiment, the intermediate layer 48 includes an $Al_xGa_{1-x}N$ ($0<x\leq1$) layer epitaxially grown on the primary surface 46a (e.g., the (0001) face) of the substrate 46. The intermediate layer 48 is doped with an n-type dopant. The intermediate layer 48 has the thickness of 50 nanometers (nm). The thickness of the intermediate layer 48 falls within the range of not less than 10 nanometers (nm) and not more than 500 nanometers (nm) and the desired thickness in this range can be realized by changing growth conditions for the intermediate layer 48. The thickness of the intermediate layer 48 over this range increases the possibility of occurrence of defects such as cracks. As in the example described later, if the thickness of the intermediate layer 48 is less than (−5x+ 1.2) micrometers (μm) where the composition ratio x of aluminum is 0<x<0.24, the occurrence of defects such as cracks can be well suppressed. The intermediate layer 48 inevitably contain carbon introduced during the process of the formation thereof, but the carbon concentration is at a level which does not degrade electric characteristics of the light emitting device 1A ($1\times10^{18}$ cm$^{-3}$ or less).

The n-type nitride semiconductor region 53 includes a layer of an n-type nitride semiconductor, for example, such as an n-type buffer layer 50. The n-type buffer layer 50 is used as an upper layer in the present embodiment. The substrate 46, intermediate layer 48, and n-type buffer layer 50 in the present embodiment can be formed by cutting the GaN substrate 28 in the first embodiment into semiconductor dies. The n-type buffer layer 50 is formed by epitaxially growing GaN on the intermediate layer 48 and is doped with an n-type dopant, such as silicon (Si), to have the n-type conductivity. The n-type buffer layer 50 has such a composition as to have a refractive index smaller than that of the light emitting layer 52 and a bandgap larger than that of the light emitting layer 52. The n-type buffer layer 50 functions as a lower cladding layer for the light emitting layer 52. In the present embodiment, the n-type buffer layer 50 has the thickness of 2 micrometers (μm).

The light emitting layer 52 is formed on the n-type nitride semiconductor region 53 (on the n-type buffer layer 50 in the present embodiment). Carriers (electrons and holes) are fed thereto from the n-type nitride semiconductor region 53 and the p-type nitride semiconductor region 55 and are recombined to generate light therein. The light emitting layer 52 in the present embodiment has a multiple quantum well structure including barrier layers and well layers which are alternately stacked. In one example, each of the well layers has the thickness of 3 nanometers (nm) and each of the three barrier layers has the thickness of 15 nanometers (nm). The barrier layers and well layers each is made from InGaN in the present example. The bandgap of the barrier layers is larger than that of the well layers by differentiating the composition ratios of indium (In) in the barrier and well layers from each other.

The p-type nitride semiconductor region 55 includes a layer of p-type nitride semiconductor, such as a p-type cladding layer 54 and a p-type contact layer 56. The p-type cladding layer 54 is formed by epitaxially growing AlGaN on the light emitting layer 52, and is doped with a p-type dopant, such as Mg, and has the p-type conductivity. The p-type cladding layer 54 has such a composition as to have a refractive index smaller than that of the light emitting layer 52 and a bandgap larger than that of the light emitting layer 52, and functions as an upper cladding layer for the light emitting layer 52. In the present embodiment, the p-type cladding layer 54 has the thickness of 20 nanometers (nm).

The p-type contact layer 56 electrically connects the p-type cladding layer 54 to the anode electrode 58B. The p-type contact layer 56 is formed by epitaxially growing GaN on the p-type cladding layer 54 and is doped with a p-type dopant, e.g., Mg, and has the p-type conductivity. In the present embodiment, the p-type contact layer 56 has the thickness of 150 nanometers (nm).

The cathode electrode 58A is made of an electrically conductive material that can achieve ohmic contact with the substrate 46. The anode electrode 58B is made of the electrically conductive material that achieves ohmic contact with the p-type nitride semiconductor region 55 (specifically, the p-type contact layer 56 in the present embodiment). The anode electrode 58B transmits light generated by the light emitting layer 52. At least a part of the anode electrode 58B may make the ohmic contact.

With reference to FIGS. 7A, 7B, 7C, 7D and 7E, a procedure of fabricating the light emitting device 1A according to the present embodiment will be described. FIGS. 7A to 7E are views showing the procedure of fabricating the light emitting device 1A.

First, the GaN epitaxial substrate 28 in the first embodiment is prepared. Specifically, a GaN single crystal substrate 14 is placed in the tray 20 on the susceptor 18 in the flow channel 12 as shown in FIG. 1 (FIG. 7A). Then, the cleaning process (thermal cleaning) is carried out for the primary surface 14a of the substrate 14 in the same manner as in the first embodiment.

Subsequently, the temperature of the substrate 14 (substrate temperature) is kept at Celsius 1050 degrees (° C.) and the pressure is kept in the intermediate flow channel at 101 kilopascals (kPa). The Group-III source gas, Group-V source gas and dopant gas are supplied together with the aforementioned carrier gas through the nozzles 22 onto the substrate 14. Specifically, TMG, TMA, NH$_3$ and SiH$_4$ gases are supplied onto the substrate 14 to grow an intermediate layer 24 of n-type AlGaN on the primary surface 14a of the substrate 14 (intermediate layer forming step, FIG. 7B). The growth conditions are preferably adjusted so that the composition of the intermediate layer 24 becomes Al$_x$Ga$_{1-x}$N (0<x<0.24). The time period for the growth is chosen so that the thickness of the intermediate layer 24 becomes less than (−5x+1.2) micrometers (μm).

Then, TMG, NH$_3$, and SiH$_4$ gases are supplied onto the intermediate layer 24 to epitaxially grow an n-type buffer layer, such as an n-type GaN upper layer 26, on the intermediate layer 24, and the substrate temperature and the pressure in the intermediate flow channel are maintained at Celsius 1050 degrees (° C.) and at 101 kilopascals (kPa), respectively (FIG. 7C). The GaN epitaxial substrate 28 including the substrate 14, intermediate layer 24 and upper layer 26 is obtained.

Subsequently, the substrate temperature is decreased to Celsius 800 degrees (° C.), and TMG, TMI, and NH$_3$ gases are supplied onto the upper layer 26 to epitaxially grow a light emitting layer 66 of InGaN thereon. In this example, a quantum well structure is formed by periodically changing the flow rates of TMG, TMI, and NH$_3$ or the like to form barrier layers and well layers. The substrate temperature is increased to Celsius 1000 degrees (° C.), and TMG, TMA, NH$_3$ and Cp$_2$Mg gases are supplied onto the light emitting layer 66 to epitaxially grow a p-type cladding layer 68 of AlGaN on the light emitting layer 66. Then, the substrate temperature is kept to Celsius 1000 degrees (° C.), and TMG, NH$_3$, and Cp$_2$Mg gases are supplied onto the p-type cladding layer 68 to epitaxially grow a p-type contact layer 70 of GaN on the p-type cladding layer 68 (semiconductor region forming step as shown in FIG. 7D).

Next, the GaN epitaxial substrate 28 including the light emitting layer 66, the p-type cladding layer 68 and the p-type contact layer 70 is taken out of the flow channel 12. The film 58A for cathode electrodes is formed on the back surface of the GaN substrate 28 by vapor deposition or the like, and the film 58B for anode electrodes is formed on the p-type contact layer 70 by vapor deposition or the like. Then, the GaN epitaxial substrate 28 is divided into device units of a chip shape, i.e., semiconductor dies, to complete the light emitting device 1A that has the substrate 46, the intermediate layer 48, the n-type buffer layer 50, the light emitting layer 52, the p-type cladding layer 54 and the p-type contact layer 56 (FIG. 7E).

The effects of the light emitting device 1A and the production method thereof according to the present embodiment as above will be described below. As discussed in the description of the first embodiment, if a GaN layer is directly grown on a GaN single crystal substrate, the uniform epitaxial growth of the GaN layer does not occur on parts of the surface of the substrate to form pits on the surfaces (FIGS. 14 and 15), resulting in the poor flatness of the surface of the intermediate layer. In contrast, the light emitting device 1A according to the present embodiment includes the intermediate AlGaN layer 24 (48) on the substrate 14 (46) and the fabrication method thereof includes the step of forming the intermediate layer 24 (48) of AlGaN on the substrate 14 (46). Even though contaminants remain on those parts of the surface of the substrate 46 and the high dislocations regions 14c appear at the surface of the substrate 14 (46), AlGaN grows over the whole surface of the substrate 46, and thus the surface 48a of the intermediate layer 48 can be made flat. Therefore, if one or more layers are deposited on the intermediate layer 48, the interfaces (growth surface) of these layers can be made flat, whereby the device characteristics, such as the emission amount of the light emitting device 1A, can be improved.

Even if the intermediate layer 24 (48) is grown under the relatively high pressure of not less than 80 kilopascals (kPa), the surface 48*a* of the intermediate layer 48 can be made flat because AlGaN grows over the entire surface 14*a* (46*a*), i.e., on the tops of the high dislocation regions and on areas of which contaminants are acquired. Thus, the n-type buffer layer 50, the light emitting layer 52, the p-type cladding layer 54 and the p-type contact layer 56 are grown on the intermediate layer 48 under such relatively high pressure and their interface can be made flat. Since these layers can be grown under the relatively high pressure, the crystallinity thereof can be made better. Accordingly, the device characteristics of the nitride semiconductor device are improved.

It is preferable that the n-type nitride semiconductor region 53 include the n-type buffer layer 50 of GaN epitaxially grown on the intermediate layer 48 in the present embodiment. In the n-type nitride semiconductor region 53 including the n-type buffer layer 50, even if there exists small unevenness in the surface 46*a* of the substrate 46 due to, for example, a certain processing or the like and this small unevenness causes small unevenness on the surface 48*a* of the intermediate layer 48, the growth surface (the surface of the n-type buffer layer 50) can be made flat by epitaxially growing the n-type buffer layer 50 on the intermediate layer 48. Therefore, the crystallinity of one or more layers epitaxially grown on the n-type buffer layer 50 is also improved and the device characteristics, such as the emission amount, in the light emitting device 1A are made excellent.

In the present embodiment, it is preferable that the intermediate layer 48 be doped with an n-type dopant to have the n-type conductivity. The doping lowers the resistivity of the intermediate layer 48, so that the device characteristics, such as the emission amount, are made excellent in the light emitting device 1A, e.g., a vertical type light emitting device in which the substrate 46 is provided between the cathode electrode 58A and the anode electrode 58B. In one example of the present embodiment, the intermediate layer 48 is doped with an n-type dopant, but it may be doped with a p-type dopant, depending upon the structure of light emitting device.

The density of the high dislocation regions is equal to or more than 100 cm$^{-2}$ at the surface of the substrate 46 as in the substrate 14. According to the light emitting device 1A and the fabrication method of the present invention, the surfaces of the intermediate layer 48 and semiconductor layers formed thereon can be made flat.

In the present embodiment, a light generating region 52*a* in the light emitting layer 52 is provided on ones of the high dislocation regions 46*c*. In the light emitting devices 1A, it is preferable that the crystallinity of the light emitting layer 52 (particularly to the light generating region 52*a*) should be made excellent. Without the present embodiments, it has been hard to grow a light emitting layer having an excellent crystallinity on the high dislocation regions 14*c*, thereby preventing the fabrication of high-intensity light emitting devices. On the contrary, since the surface of the light emitting layer 52 of the light emitting device 1A can be made flat independent of the arrangement of the high dislocation regions 14*c* in the substrate 46, the crystallinity of the light generating region 52*a* becomes excellent. The light generating region 52*a* is provided between the cathode electrode 58A and the anode electrode 58B, and generates light in response to the supply of carriers through the supply surfaces of the cathode electrode 58A and anode electrode 58B. The supply surfaces of the cathode electrode 58A and anode electrode 58B contact with semiconductor regions of the light emitting device 1A. Some of the high dislocation regions 14*c* are located between the cathode electrode 58A and the anode electrode 58B.

Please note that the intermediate layer 48 in the present embodiment is different from so-called cladding layers. In light emitting diodes (LEDs) like the nitride semiconductor device of the present embodiment, the thickness of the cladding layer should be relatively large in order to confine light to the light emitting layer. For example, the n-type buffer layer 50 in the present embodiment has the thickness of 2 micrometers (μm). On the other hand, the intermediate layer 48 in one example of the present embodiment has the thickness of 50 nanometers (nm). Even in such relatively small thickness, the intermediate layer 48 can have the technical effects as mentioned above.

Figure 8:
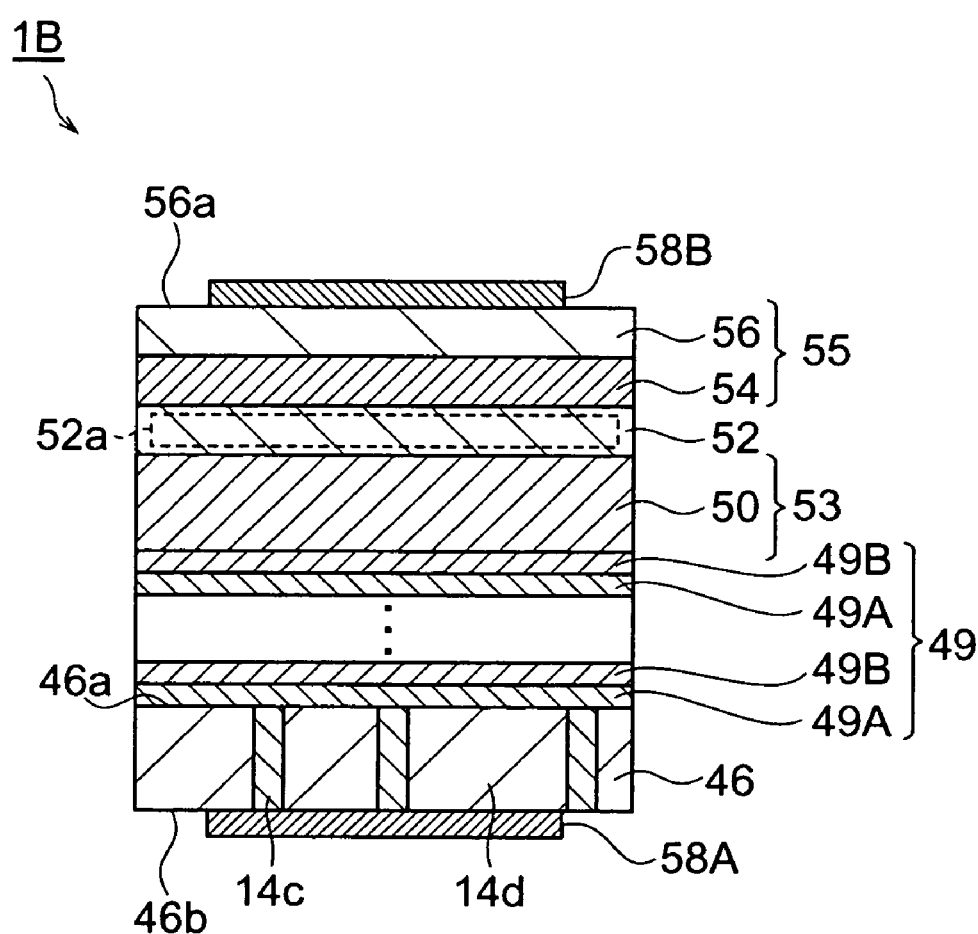
FIG. 8 is a cross sectional view showing a light emitting device.

Next, a light emitting device 1B different from the aforementioned light emitting device 1A will be described with reference to FIG. 8. FIG. 8 is a cross sectional view showing the light emitting device 1B. The light emitting device 1B is different from the light emitting device 1A in the structure of the intermediate layer 49. The structure of the light emitting device 1B is similar to that of the aforementioned light emitting device 1A except an intermediate layer 49 in the light emitting device 1B, and thus the detailed description will be omitted except for the description of the intermediate layer 49.

The light emitting device 1B has the intermediate layer 49 provided on the surface 46*a* of the substrate 46. The intermediate layer 49 is constituted by first layers 49A and second layers 49B, and the first layers 49A and the second layers 49B are deposited alternately. The first layers 49A are made of $Al_xGa_{1-x}N$ ($0<x\leq1$) doped with an n-type dopant, and the second layers 49B of $Al_yGa_{1-y}N$ ($0\leq y \leq 1$, $y\neq x$) doped with an n-type dopant. In the present embodiment, the first layers 49A and second layers 49B are alternately arranged on the surface 46*a* of the substrate 46 to constitute a superlattice structure (strained superlattice structure), and the number of the first and second layers 49A and 49B in the superlattice structure is, for example, ten. The first layers 49A and the second layers 49B each have the thickness, for example, of 10 nanometers (nm).

A method of fabricating the light emitting device 1B is similar to that of the light emitting device 1A except for the following: in the step of forming the intermediate layer 49 in the method of fabricating the light emitting device 1B, for example, the switching valve located upstream of the nozzles 22 (as shown in FIG. 1) is switched to stop the supply of TMA after formation of a first layer 49A, and a second layer 49B of GaN (i.e., $Al_yGa_{1-y}N$ ($y=0$)) is deposited on the first layer 49A. After a number of cycles of turning on/off the switching valve, for example ten layers, the first layers 49A and second layers 49B are alternately deposited to form the superlattice structure including ten layers.

In the above light emitting device 1B having the intermediate layer 49 of the superlattice structure (strained layer superlattice structure) including the first layers 49A and second layers 49B, the superlattice structure prevents threading dislocations from extending from the substrate 46. The superlattice structure reduces the dislocation densities of the n-type nitride semiconductor region 53, light emitting layer 52 and p-type nitride semiconductor region 55 to improve their crystallinity, whereby the device characteristics, such as emission luminance, can be made excellent. The superlattice structure including the first layers 49A and the second layers 49B should not be limited to the ten-layer structure as above, but the number of layers may be changed as required.

Figure 9:
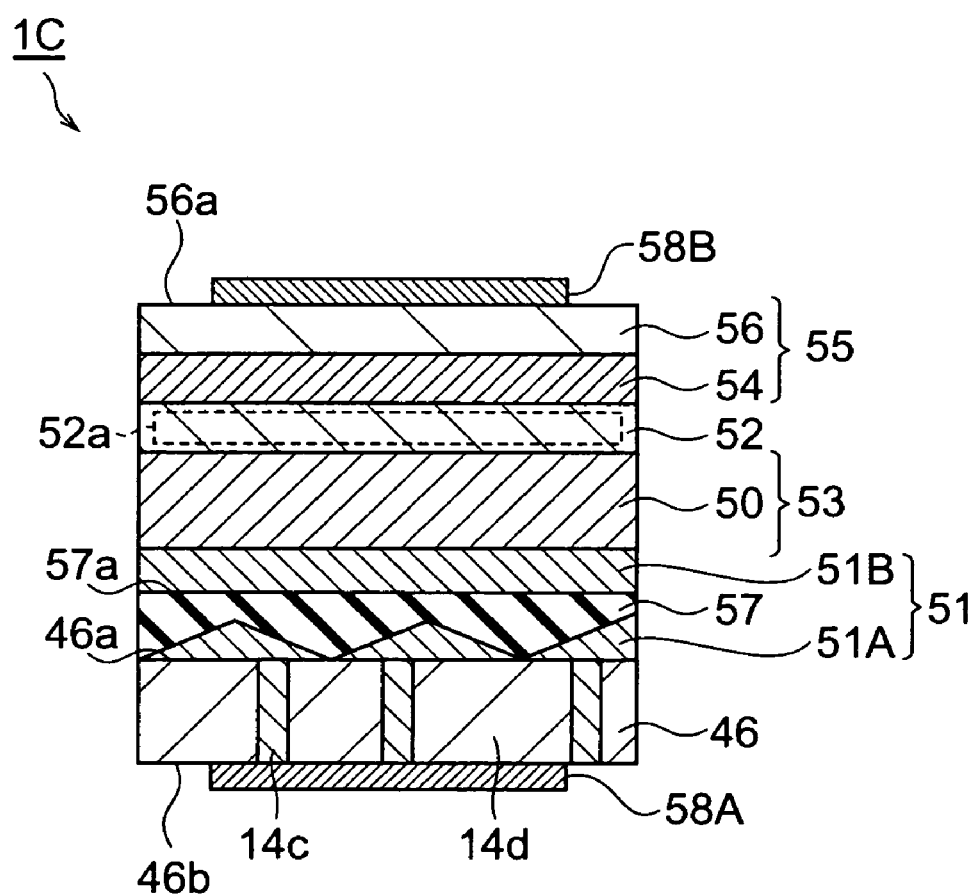
FIG. 9 is a cross sectional view showing a light emitting device.

With reference to FIG. 9, a light emitting device 1C different from the aforementioned light emitting devices 1A and 1B will be described below. FIG. 9 is a cross sectional view showing the light emitting device 1C. The light emitting device 1C is different from the light emitting devices 1A and 1B in that the light emitting device 1C has an InGaN epitaxial layer 57 between intermediate layers 51A and 51B. The structure of the light emitting device 1C is similar to those of the aforementioned light emitting devices 1A and 1B except that the light emitting device 1C has the InGaN epitaxial layer 57, and the detailed description will be omitted except for the description of the InGaN epitaxial layer 57.

The light emitting device 1C has intermediate layers 51 provided on the surface 46a of the substrate 46. The intermediate layers 51 are constituted by the first layer 51A and the second layer 51B. The light emitting device 1C has an InGaN epitaxial layer 57 provided between the first layer 51A and the second layer 51B of the intermediate layers 51. Each of the first layer 51A and the second layer 51B is made of $Al_xGa_{1-x}N$ ($0<x\leq1$) doped with a n-type dopant, and the InGaN epitaxial layer 57 is made of $In_zGa_{1-z}N$ ($0<z\leq1$) doped with a n-type dopant.

A method of fabricating the light emitting device 1C is similar to that of the light emitting device 1A except for the following: in the step of forming the intermediate layers 51 of the light emitting device 1C, TMG, TMI, $NH_3$ and $SiH_4$ gases are supplied onto the first layer 51A to grow the InGaN epitaxial layer 57 of n-type $In_zGa_{1-z}N$ ($0<z\leq1$) after forming the first layer 51A of n-type AlGaN. Then, an n-type AlGaN is grown on the InGaN epitaxial layer 57 to form the second layer 51B.

As shown in FIG. 9, the first layer 51A has been formed as a result of an abnormal growth. An abnormal growth of semiconductor layers may occur on the substrate 46 for various reasons even if a layer of AlGaN may be deposited thereon. In the light emitting device 1C, the epitaxial layer 57 of $In_zGa_{1-z}N$ ($0<z\leq1$) is grown on the first layer 51A. Even when the surface 46a of the substrate 46 is heavily contaminated and the crystallinity of the high dislocation regions 14c is extremely low to cause abnormal growth of the first layer 51A and to fail to achieve a satisfactory evenness of the first layer 51A, the layer of InGaN is deposited on the first layer 51A to obtain the flat surface 57a as compared to that of the first layer 51A.

Examples of the second embodiment will be described below.

FIRST EXAMPLE

A blue light emitting device 1A is fabricated as a first example.

First, the substrate 14 of a GaN single crystal like a wafer is placed in the tray 20 on the susceptor 18. The pressure in the flow channel 12 (pressure in a furnace) is kept at 101 kilopascals (kPa), $NH_3$ and $H_2$ gases are supplied to the flow channel 12 and the temperature of the substrate 14 is maintained at Celsius 1050 degrees (° C.) for ten minutes to clean the surface 60a. Then, the substrate temperature and the furnace pressure are kept at Celsius 1050 degrees (° C.) and 101 kilopascals (kPa), respectively, and TMA, TMG, $NH_3$, and $SiH_4$ gases are supplied to the flow channel 12 to grow the intermediate layer 24, for example, an n-type $Al_{0.07}Ga_{0.93}N$ layer in the thickness of 50 nanometers (nm). Thereafter, the substrate temperature and the furnace pressure are kept unchanged, and the upper layer 26 is grown as the n-type GaN buffer layer 50 in the thickness of 2 micrometers (μm), thereby obtaining the GaN epitaxial substrate 28.

Then, the substrate temperature is decreased to Celsius 800 degrees (° C.), and InGaN barrier layers of 15 nanometer thickness and InGaN well layers of 3 nanometer thickness are alternately grown over three cycles, thus forming a light emitting layer 66. Thereafter, the substrate temperature is again increased to Celsius 1000 degrees (° C.), and TMA, TMG, $NH_3$ and $Cp_2Mg$ gases are supplied to the flow channel 12 to grow a p-type cladding layer of $Al_{0.12}Ga_{0.88}N$ in the thickness of 20 nanometers (nm). Then, TMG, $NH_3$ and $Cp_2Mg$ gases are supplied to grow a p-type contact layer of GaN in the thickness of 50 nanometers (nm).

Figure 10:
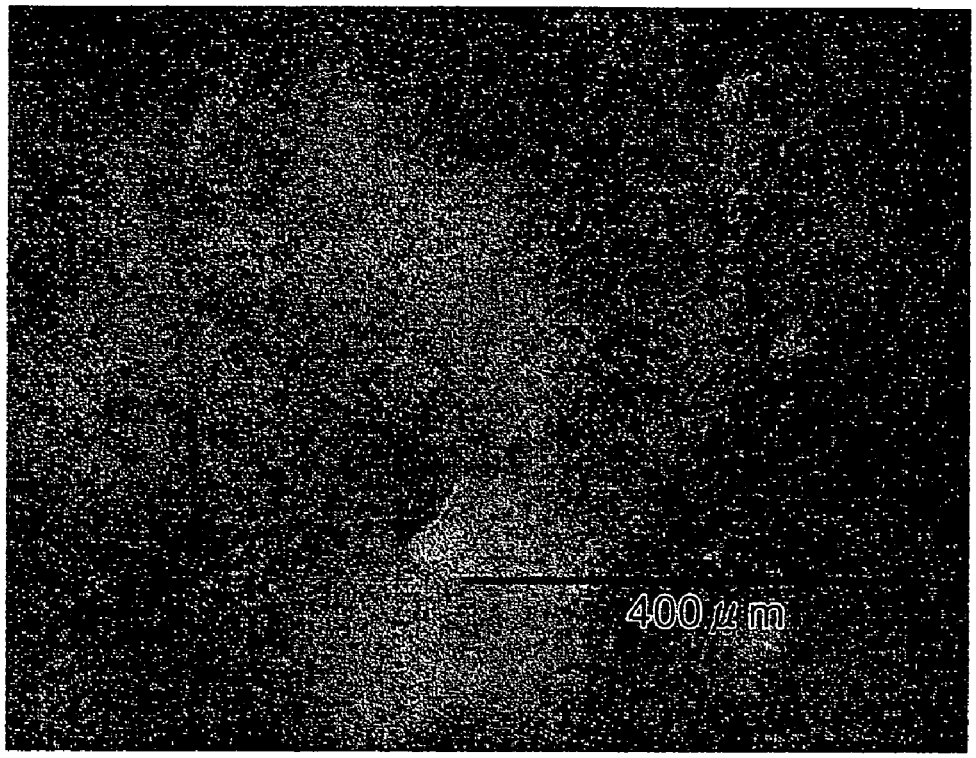
FIG. 10 is a view, taken with a differential interference microscope, showing the surface of a p-type contact layer in a light emitting device fabricated in the first example.

FIG. 10 is a view showing the surface of the p-type contact layer in the light emitting device 1A fabricated as the present example. This is a photograph taken with a differential interference microscope. It is seen from FIG. 10 that the surface of the p-type contact layer is flat with little unevenness. The surface of the p-type contact layer of the uppermost layer reflects flatness of the interfaces (growth surfaces) of lower layers, such as the p-type cladding layer, light emitting layer and upper layer, and thus we can expect from the photograph shown in FIG. 10 that the interfaces of the p-type cladding layer 68, light emitting layer 66, and upper layer 26 are also flat.

Thereafter, the cathode electrode 58A is formed on the back surface of the GaN epitaxial substrate 28, and the anode electrode 58B is formed on the p-type contact layer. Thus, the GaN epitaxial substrate 28 is divided into semiconductor dies to complete light emitting devices, such as the light emitting device 1A. When current is continuously applied to a bare chip (device before packaging) of a light emitting device fabricated as above, the wavelength of emission is 450 nanometers (nm) at 20 milliamperes (mA) and the power of emission is 3 milliwatts (mW).

Figures 11A, 11B:
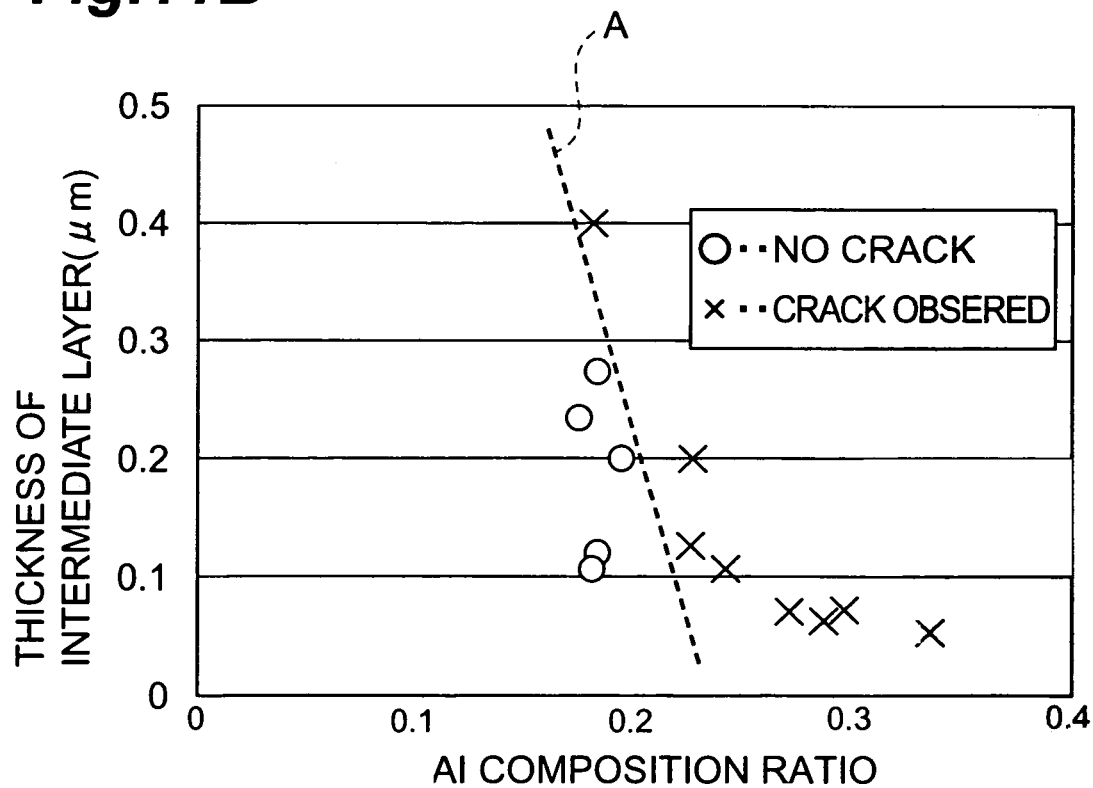
FIG. 11A is a view showing the summary of the relationship between the aluminum composition of the intermediate layers and the thickness thereof with presence/absence of cracks, for thirteen types of intermediate layers.
FIG. 11B is a graph showing the relationship between the aluminum composition of the intermediate layers and the thickness thereof with presence/absence of cracks, for thirteen types of intermediate layers listed in FIG. 11A.

Furthermore, the inventors have fabricated light emitting devices like the light emitting device 1A in the various thickness and various aluminum composition ratio of the intermediate layer 48 as examples. FIG. 11A shows a summary representing the results of investigation on presence/absence of cracks, for each of the intermediate layers 48 prepared in thirteen levels of thickness values and aluminum composition ratios. The summary also presents the thickness values of the intermediate layers 48, and the aluminum composition ratios x derived from PL wavelength.

FIG. 11B is a graph showing the relationship between thickness and Al composition ratio with the presence/absence of cracks, for the thirteen types of intermediate layers 48 listed in FIG. 11A. It is apparent from FIG. 11B that the presence/absence of crack in the intermediate layer 48 is definitely different on both sides of a line A (thickness=−5x+1.2, 0<x<0.24). FIG. 11B clearly reveals that the intermediate layer 48 is suitably grown without occurrence of cracks if the thickness of the intermediate layer 48 is less than (−5x+1.2) micrometers (μm) where the Al composition ratio x is within the range of 0<x<0.24.

SECOND EXAMPLE

A blue light emitting device 1B has been fabricated as a second example. First, the substrate 14 is placed in the tray 20 and the surface 14a thereof is cleaned in the same manner as in the first example. Then, the substrate temperature and the furnace pressure is kept at Celsius 1050 degrees (° C.) and at 101 kilopascals (kPa), respectively, and TMA, TMG, $NH_3$ and $SiH_4$ gases are supplied to the flow channel 12 to alternately deposit ten cycles of n-type $Al_{0.14}Ga_{0.86}N$ layers in the thickness of 10 nanometers (nm) and n-type GaN layers in the thickness of 10 nanometers (nm), thereby growing an intermediate layer. Thereafter, an n-type buffer layer, a light emitting layer, a p-type cladding layer and a p-type contact layer are grown in the same manner as that in the first example. The surface of the p-type contact layer grown as above is observed with a differential interference microscope and this photograph reveals that the surface of the p-type contact layer is made flat as in the first example.

Thereafter, the cathode electrode 58A is formed on the back surface of the substrate 14 and the anode electrode 58B is formed on the p-type contact layer. Then, the substrate 14 is divided into semiconductor dies to complete light emitting devices, such as the light emitting device 1B. When current is continuously applied to a bare chip (device before packaging) of a light emitting device fabricated as above, the wavelength of emission is 450 nanometers (nm) at 20 milliamperes (mA) and the power of emission is 5 milliwatts (mW).

EXPERIMENT EXAMPLE

Subsequently, an experiment example for verifying the technical effects as shown in the above examples will be presented. A light emitting device without an intermediate layer has been formed as an example.

First, a GaN single crystal substrate is placed in the tray 20 on the susceptor 18 and the surface thereof is cleaned in the same manner as in the first example. Then, while keeping the substrate temperature at Celsius 1050 degrees (° C.) and the furnace pressure at 101 kilopascals (kPa), TMG, $NH_3$ and $SiH_4$ are supplied the flow channel 12 to grow n-type GaN in the thickness of 2 micrometers (μm). Thereafter, a light emitting layer, a p-type cladding layer, and a p-type contact layer are successively grown in the same manner as in the first example.

Figure 12:
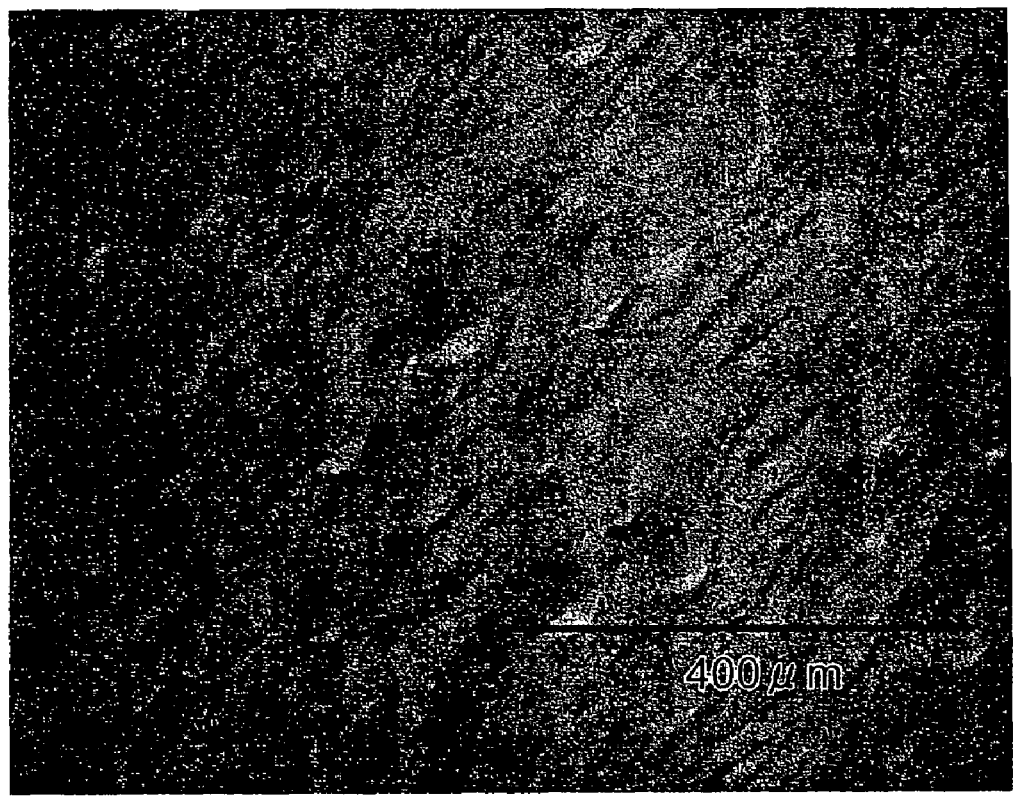
FIG. 12 is a view, taken with a differential interference microscope, showing a surface of a p-type contact layer in a light emitting device fabricated in another example.

FIG. 12 is a view showing the surface of the p-type contact layer in the light emitting device fabricated as the experiment example. This is a photograph taken with a differential interference microscope. As shown in FIG. 12, the surface of the p-type contact layer in this example is considerably uneven and the flatness thereof is not good. Therefore, we can presume that the interfaces of the p-type cladding layer, light emitting layer, and n-type buffer layer also have poor flatness.

Thereafter, the cathode electrode is formed on the back surface of the substrate and the anode electrode is formed on the p-type contact layer. Then, the substrate is divided into semiconductor dies to complete light emitting devices. Current is continuously applied to a bare chip of a light emitting device fabricated as above, and the wavelength of emission is 450 nanometers (nm) at the current of 20 milliamperes (mA) and the power of emission is only 1 milliwatts (mW). This proves that the intermediate layer provided on the substrate is effective in improving the device characteristics of the light emitting devices or the like as in each of the above examples.

The present invention is not limited to the above embodiments and examples, but can be modified in various ways. For example, the compositions of $Al_xGa_{1-x}N$ (0<x≦1) and $Al_yGa_{1-y}N$ (0≦y≦1) for the intermediate layer are not limited to x=0.08, x=0.16, and y=0, but they can be changed as required. The composition of $In_zGa_{1-z}N$ for the InGaN epitaxial layer is not limited to z=0.10, but it can be changed in the range of 0<z≦1 as required.

In the second embodiment, the n-type semiconductor region is formed on the intermediate layer and the p-type semiconductor region is formed on the active layer, but it is also possible that the p-type semiconductor region is formed on the intermediate layer and that the n-type semiconductor region is formed on the active layer.

The second embodiment exemplifies the light emitting devices as nitride semiconductor devices of the present invention, but the present invention is not limited thereto and can also be suitably applied to transistors and others made of GaN based material having the n-type region and p-type region.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A GaN substrate comprising:
    a GaN single crystal substrate including a low dislocation region and high dislocation regions, the low dislocation region having a first density of threading dislocations, the high dislocation regions each having a second density of threading dislocations, the low dislocation region surrounding each high dislocation region, the second density of threading dislocations in high dislocation regions being higher than the first density of threading dislocations in the low dislocation region, the low dislocation region and the high dislocation regions appearing at a surface of the GaN single crystal substrate;
    a first $Al_xGa_{1-x}N$ intermediate epitaxial layer (0<x<0.24) provided on the surface in a thickness of less than (−5x−1.2) micrometers; and
    a GaN epitaxial layer provided at the first $Al_xGa_{1-x}N$ intermediate epitaxial layer.

2. The GaN substrate according to claim 1, wherein the high dislocation regions are distributed in the low dislocation region and a density of the high dislocation regions on the surface is equal to or greater than 100 $cm^{-2}$.

3. The GaN substrate according to claim 1, wherein the first $Al_xGa_{1-x}N$ intermediate epitaxial layer contains carbon and a concentration of carbon in the intermediate layer is not more than $1 \times -10^{18}$ $cm^{-3}$ and not less than $1 \times -10^{13}$ $cm^{-3}$.

4. The GaN substrate according to claim 1, wherein the first $Al_xGa_{1-x}N$ intermediate epitaxial layer is doped with a dopant and the doped first $Al_xGa_{1-x}N$ intermediate layer has one of an n-type conductivity and a p-type conductivity.

5. The GaN substrate according to claim 1, further comprising a second $Al_yGa_{1-y}N$ intermediate layer (0≦y≦1) and a third $Al_zGa_{1-z}N$ intermediate layer (0≦z≦1), the first $Al_xGa_{1-x}N$ intermediate epitaxial layer and the third $Al_zGa_{1-z}N$ intermediate epitaxial layer being different in composition from the second $Al_yGa_{1-y}N$ intermediate layer, the first $Al_xGa_{1-x}N$ intermediate layer, the second $Al_yGa_{1-y}N$ intermediate layer and the third $Al_zGa_{1-z}N$ intermediate layer being arranged to form a superlattice structure.

6. The GaN substrate according to claim 5, further comprising:
    a fourth $Al_uGa_{1-u}N$ epitaxial intermediate Layer (0<u≦1); and
    an $In_vGa_{1-v}N$ epitaxial layer (0<v≦1) provided between the first $Al_xGa_{1-x}N$ intermediate epitaxial layer and the fourth $Al_uGa_{1-u}N$ epitaxial intermediate layer.

7. A GaN substrate comprising:
    a GaN single crystal substrate;
    a first $Al_xGa_{1-x}N$ intermediate epitaxial layer (0<x<0.24) provided in a thickness of less than (−5x−1.2) micrometers on the GaN single crystal substrate; and
    a GaN epitaxial layer provided on the intermediate layer.

8. The GaN substrate according to claim 7, wherein the first intermediate $Al_xGa_{1-x}N$ epitaxial layer contains carbon and a concentration of carbon in the intermediate layer is not more than $1 \times -10^{18}$ $cm^{-3}$ and not less than $1 \times -10^{13}$ $cm^{-3}$.

9. The GaN substrate according to claim 7, wherein the first $Al_xGa_{1-x}N$ intermediate epitaxial layer is doped with a dopant and the doped first $Al_xGa_{1-x}N$ intermediate layer has one of an n-type conductivity and a p-type conductivity.

10. The GaN substrate according to claim 7, further comprising a second $Al_yGa_{1-y}N$ intermediate layer ($0 \leq y \leq 1$) and a third $Al_zGa_{1-z}N$ intermediate layer ($0 \leq z \leq 1$), the first $Al_xGa_{1-x}N$ intermediate epitaxial layer and the third $Al_zGa_{1-z}N$ intermediate epitaxial layer being different in composition from the second $Al_yGa_{1-y}N$ intermediate layer ($y \neq z$), the first $Al_xGa_{1-x}N$ intermediate layer, the second $Al_yGa_{1-y}N$ intermediate layer and the third $Al_zGa_{1-z}N$ intermediate layer being arranged to form a superlattice structure.

11. The GaN substrate according to claim 10, further comprising:
   a fourth $Al_uGa_{1-u}N$ epitaxial intermediate layer ($0^{21\ u} \leq 1$); and
   an $In_vGa_{1-v}N$ epitaxial layer ($0<v \leq 1$) provided between the first $Al_xGa_{1-x}N$ intermediate epitaxial layer and the fourth $Al_uGa_{1-u}N$ epitaxial intermediate layer.

12. A method of fabricating a GaN substrate, comprising the steps of:
   epitaxially growing a first $Al_xGa_{1-x}N$ intermediate layer ($0<x<0.24$) in a thickness of less than ($-5x-1.2$) micrometers on a surface of a GaN single crystal substrate, the GaN single crystal substrate including a low dislocation region and high dislocation regions, the low dislocation region surrounding each high dislocation regions, the low dislocation region having a first density of threading dislocations, the high dislocation regions each having a second density of threading dislocations, the second density of threading dislocations in high dislocation regions being higher than the first density of threading dislocations in the low dislocation region, the low dislocation region and the high dislocation regions appearing at the surface of the GaN single crystal substrate; and
   epitaxially growing an GaN layer on the first $Al_xGa_{1-x}N$ intermediate layer.

13. The method according to claim 12, wherein a density of the high dislocation regions at the surface is equal to or greater than 100 cm$^{-2}$.

14. The method according to claim 12, wherein the first $Al_xGa_{1-x}N$ intermediate layer contains carbon and a concentration of carbon in the first $Al_xGa_{1-x}N$ intermediate layer is not more than $1 \times 10^{18}$ cm$^{-3}$ and not less than $1 \times 10^{13}$ cm$^{-3}$.

15. The method according to claim 12, wherein the first $Al_xGa_{1-x}N$ intermediate layer is doped with a dopant in the step of growing a first $Al_xGa_{1-x}N$ intermediate layer, and
   wherein the doped first $Al_xGa_{1-x}N$ intermediate layer has an n-type or p-type conductivity.

16. The method according to claim 12, further comprising the steps of:
   forming a second $Al_yGa_{1-y}N$ intermediate layer ($0 \leq y \leq 1$) the second $Al_yGa_{1-y}N$ intermediate layer being different in composition from the first $Al_yGa_{1-y}N$ intermediate layer; and
   forming a third $Al_zGa_{1-z}N$ intermediate layer ($0 \leq z \leq 1$) the third $Al_zGa_{1-z}N$ intermediate layer being different in composition from the second $Al_yGa_{1-y}N$ intermediate layer, the first $Al_xGa_{1-x}N$ intermediate layer, the second $Al_yGa_{1-y}N$ intermediate layer and the third $Al_zGa_{1-z}N$ intermediate layer being arranged to form a superlattice structure.

17. The method according to claim 16, further comprising the steps of:
   forming an $In_uGa_{1-u}N$ epitaxial layer ($0<u \leq 1$); and
   forming a fourth $Al_vGa_{1-v}N$ intermediate layer ($0<v \leq 1$), the $In_uGa_{1-u}N$ ($0<u \leq 1$) epitaxial layer being provided between the first $Al_xGa_{1-x}N$ intermediate layer and the fourth $Al_vGa_{1-v}N$ intermediate layer.

18. The method according to claim 12, wherein the first $Al_xGa_{1-x}N$ intermediate layer and the GaN layer are grown under a pressure of not less than 80 kilopascals.

19. A method of fabricating a GaN substrate, comprising the steps of:
   epitaxially growing a first $Al_xGa_{1-x}N$ intermediate layer ($0<x<0.24$) in a thickness of less than ($-5x-+1.2$) micrometers on a GaN single crystal substrate; and
   epitaxially growing a GaN layer on the intermediate layer.

20. The method according to claim 19, wherein the first intermediate $Al_xGa_{1-x}N$ layer contains carbon and a concentration of carbon in the first intermediate $Al_xGa_{1-x}N$ layer is not more than $1 \times 10^{18}$ cm$^{-3}$ and not less than $1 \times 10^{13}$ cm$^{-3}$.

21. The method according to claim 19, wherein the first $Al_xGa_{1-x}N$ intermediate layer is doped with a dopant in the step of growing a first $Al_xGa_{1-x}N$ intermediate layer, and
   wherein the doped first $Al_xGa_{1-x}N$ intermediate layer has an n-type or p-type conductivity.

22. The method according to claim 19, further comprising the steps of:
   forming a second $Al_yGa_{1-y}N$ intermediate layer ($0 \leq y \leq 1$) the second $Al_yGa_{1-y}N$ intermediate layer being different in composition from the first $Al_xGa_{1-x}N$ intermediate layer; and
   forming a third $Al_zGa_{1-z}N$ intermediate layer ($0 \leq z \leq 1$) the third $Al_xGa_{1-x}N$ intermediate layer being different in composition from the second $Al_yGa_{1-y}N$ intermediate layer, the first $Al_xGa_{1-x}N$ intermediate layer, the second $Al_yGa_{1-y}N$ intermediate layer and the third $Al_zGa_{1-z}N$ intermediate layer being arranged to form a superlattice structure.

23. The method according to claim 22, further comprising the steps of: forming an $In_uGa_{1-u}N$ epitaxial layer ($0<u \leq 1$); and
   forming a fourth $Al_vGa_{1-v}N$ intermediate layer ($0<v \leq 1$), the $In_uGa_{1-u}N$ ($0<u \leq 1$) epitaxial layer being provided between the first $Al_xGa_{1-x}N$ intermediate layer and the fourth $Al_vGa_{1-v}N$ intermediate layer.

24. The method according to claim 19, wherein the first $Al_xGa_{1-x}N$ intermediate layer and the GaN layer are grown under a pressure of not less than 80 kilopascals.

25. A nitride semiconductor device comprising:
   a GaN single crystal substrate including a low dislocation region and high dislocation regions, the low dislocation region having a first density of threading dislocations, each high dislocation region having a second density of threading dislocations, the low dislocation region surrounding each high dislocation regions, the second density of threading dislocations being higher than the first density of threading dislocations, the low dislocation region having a first density of threading dislocations, the high dislocation regions each having a second density of threading dislocations, the low dislocation region and the high dislocation regions appearing at a surface of the GaN single crystal substrate;
   a first $Al_xGa_{1-x}N$ intermediate epitaxial layer ($0<x<0.24$) in a thickness of less than ($-5x+1.2$) micrometers provided on the surface; and
   an n-type nitride semiconductor region and a p-type nitride semiconductor region both provided on the intermediate layer.

26. The nitride semiconductor device according to claim 25, wherein a density of the high dislocation regions at the surface is equal to or greater than 100 cm$^{-2}$.

27. The nitride semiconductor device according to claim 25, wherein one of the n-type nitride semiconductor region and the p-type nitride semiconductor region includes a GaN upper epitaxial layer provided on the first $Al_xGa_{1-x}N$ epitaxial intermediate layer.

28. The nitride semiconductor device according to claim 25, further comprising a light emitting layer provided between the n-type nitride semiconductor region and the p-type nitride semiconductor region, each of the n-type nitride semiconductor region and the p-type nitride semiconductor region including a cladding layer.

29. The nitride semiconductor device according to claim 25, further comprising a cathode electrode and an anode electrode, the GaN single crystal substrate being provided between the cathode electrode and the anode electrode, the light emitting layer including a region for generating light, the region for generating light being provided on one or more regions of the high dislocation regions, and the region for generating light being provided between the cathode electrode and the anode electrode.

30. The nitride semiconductor device according to claim 25, wherein the first $Al_xGa_{1-x}N$ intermediate epitaxial layer is doped with a dopant and the doped first $Al_xGa_{1-x}N$ intermediate layer has one of an n-type conductivity and a p-type conductivity.

31. The nitride semiconductor device according to claim 25, further comprising a second $Al_yGa_{1-y}N$ intermediate epitaxial layer ($0 \leq y \leq 1$) and a third $Al_zGa_{1-z}N$ intermediate epitaxial layer ($0 \leq z \leq 1$) the first $Al_xGa_{1-x}N$ intermediate epitaxial layer and the third $Al_zGa_{1-z}N$ intermediate epitaxial layer being different in composition from the second $Al_yGa_{1-y}N$ intermediate layer, the first $Al_xGa_{1-x}N$ intermediate layer, the second $Al_yGa_{1-y}N$ intermediate epitaxial layer and the third $Al_zGa_{1-z}N$ intermediate epitaxial layer being arranged to form a superlattice structure.

32. The nitride semiconductor device according to claim 31, further comprising:
a fourth $Al_uGa_{1-u}N$ epitaxial intermediate layer ($0<u \leq 1$); and
an $In_yGa_{1-y}N$ epitaxial layer ($0<y \leq 1$) provided between the first intermediate $Al_xGa_{1-x}N$ epitaxial layer and the fourth $Al_uGa_{1-u}N$ epitaxial intermediate layer.

33. A method of fabricating a nitride semiconductor device, comprising the steps of:
epitaxially growing an intermediate $Al_xGa_{1-x}N$ layer ($0<x<0.24$) in a thickness of less than $(-5x+1.2)$ micrometers on a surface of a GaN single crystal substrate under a pressure of not less than 80 kilopascals, the GaN single crystal substrate including a low dislocation region and high dislocation regions, the low dislocation region surrounding each high dislocation regions, each high dislocation region having a second density of threading dislocations, the low dislocation region having a first density of threading dislocations, the second density of threading dislocations in high dislocation regions being higher than the first density of threading dislocations in the low dislocation region, the low dislocation region and the high dislocation regions appearing at a surface of the substrate; and
epitaxially growing an n-type nitride semiconductor region and a p-type nitride semiconductor region on the intermediate layer under a pressure of not less than 80 kilopascals.

34. The method according to claim 33, wherein a density of the high dislocation regions on the surface is equal to or greater than $100$ $cm^{-2}$.

* * * * *